United States Patent
Cho et al.

(10) Patent No.: US 12,527,225 B2
(45) Date of Patent: Jan. 13, 2026

(54) METHOD FOR MANUFACTURING DEVICE COMPRISING HALIDE PEROVSKITE ACTIVE LAYER, AND POWER GENERATION DEVICES

(71) Applicant: UIF (University Industry Foundation), Yonsei University, Seoul (KR)

(72) Inventors: Yong Soo Cho, Seoul (KR); Da Bin Kim, Seoul (KR)

(73) Assignee: UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 858 days.

(21) Appl. No.: 17/842,204

(22) Filed: Jun. 16, 2022

(65) Prior Publication Data

US 2022/0406990 A1    Dec. 22, 2022

(30) Foreign Application Priority Data

Jun. 18, 2021   (KR) ..................... 10-2021-0079237

(51) Int. Cl.
| | | |
|---|---|---|
| *H01L 41/39* | (2013.01) | |
| *H01L 31/0236* | (2006.01) | |
| *H01L 31/032* | (2006.01) | |
| *H01L 31/103* | (2006.01) | |
| *H01L 41/08* | (2006.01) | |

(Continued)

(52) U.S. Cl.
CPC ......... *H10N 30/852* (2023.02); *H10F 30/221* (2025.01); *H10F 77/12* (2025.01); *H10F 77/707* (2025.01); *H10K 71/40* (2023.02); *H10K 85/50* (2023.02); *H10N 30/074* (2023.02); *H10N 30/093* (2023.02); *H10N 30/304* (2023.02);

(Continued)

(58) Field of Classification Search
CPC .. H10N 30/074; H10N 30/093; H10N 30/304; H10N 30/706; H10N 30/852; H10F 30/221; H10F 77/12; H10F 77/707; H10K 30/20; H10K 30/50; H10K 71/40; H10K 85/50
USPC .......................................................... 310/311
See application file for complete search history.

(56) References Cited

FOREIGN PATENT DOCUMENTS

| KR | 10-2018-0073165 A | 7/2018 |
|---|---|---|
| KR | 10-2216637 B1 | 2/2021 |
| KR | 10-2021-0021860 A | 3/2021 |

OTHER PUBLICATIONS

Dandan Hao et al., "Recent developments in flexible photodetectors based on metal halide perovskite", InfoMat., Sep. 26, 2019, pp. 139-169.

(Continued)

*Primary Examiner* — Emily P Pham
*Assistant Examiner* — Monica Mata
(74) *Attorney, Agent, or Firm* — Paratus Law Group, PLLC

(57) ABSTRACT

A power generation device manufacturing method and a power generation device are proposed. In one embodiment, the method includes (a) forming a halide perovskite active layer on a flexible substrate bent by a stress applied thereto and (b) releasing the stress applied to the substrate on which the halide perovskite active layer is formed, thereby unfolding the bent substrate. By applying a strain to the active layer of the power generation device and controlling the same, using the method described above, it is possible to improve the performance of the power generation device without changing the composition of the active layer or the configuration of the device.

6 Claims, 43 Drawing Sheets

(51) Int. Cl.
  *H01L 41/113* (2006.01)
  *H01L 41/18* (2006.01)
  *H01L 41/314* (2013.01)
  *H10F 30/221* (2025.01)
  *H10F 77/12* (2025.01)
  *H10F 77/70* (2025.01)
  *H10K 71/40* (2023.01)
  *H10K 85/50* (2023.01)
  *H10N 30/00* (2023.01)
  *H10N 30/074* (2023.01)
  *H10N 30/093* (2023.01)
  *H10N 30/30* (2023.01)
  *H10N 30/85* (2023.01)
  *H10K 30/20* (2023.01)
  *H10K 30/50* (2023.01)

(52) U.S. Cl.
  CPC ........... *H10N 30/706* (2024.05); *H10K 30/20* (2023.02); *H10K 30/50* (2023.02)

(56) References Cited

OTHER PUBLICATIONS

Seung Min Lee et al., "Experimental Demonstration of in Situ Stress-Driven Optical Modulations in Flexible Semiconducting Thin Films with Enhanced Photodetecting Capability", Chem Mater., Oct. 8, 2018, pp. 7776-7781.

Ye Seul Jung et al., "Anisotropic in-situ stretching-strain engineering of flexible multilayer thin-film nanogenerators with Cu interlayers", Nano Energy, Dec. 16, 2020, pp. 1-7.

Korean Office Action for related KR Application No. 10-2021-0079237 mailed Jun. 1, 2023 from Korean Intellectual Property Office.

Hui-Seon Kim et al., "Importance of tailoring lattice strain in halide perovskite crystals", NPG Asia Materials, Dec. 11, 2020, pp. 1-14, vol. 12, No. 78.

METHOD FOR MANUFACTURING DEVICE COMPRISING HALIDE PEROVSKITE ACTIVE LAYER, AND POWER GENERATION DEVICES

CROSS-REFERENCE TO RELATED APPLICATION

This application claims priority to Korean Patent Application No. 10-2021-0079237 (filed on Jun. 18, 2021), which is hereby incorporated by reference in its entirety.

BACKGROUND

The present disclosure relates to a method of manufacturing a device including a halide perovskite active layer and to a power generation device.

A power generation device is a device that generates electricity. Various power generation devices such as thermoelectric, photoelectric, piezoelectric, and magnetoelectric devices are being developed. Among them, a photoelectric device is a device that converts optical energy into electrical energy. The photoelectric device generates an electrical signal or electric power in response to light such as visible light, infrared rays, or ultraviolet lays. For example, a solar cell, a light emitting device, and a photodetector fall within the scope of the photoelectric device. A piezoelectric device is an element that generates a voltage when a mechanical external force is applied thereof or is an element that deforms when an electric voltage is applied thereto. The piezoelectric device is widely used, for example, in ultra-precision actuators, ultrasonic motors, transducers, and various precision sensors, measuring instruments, and medical devices such as ultrasonic blood flowmeters.

On the other hand, perovskite has excellent efficiency in converting external energy such as light into electricity and is easy to manufacture, so the perovskite is being used in various fields as a material for next-generation power generation devices. In particular, halide perovskite can be synthesized in a solution process at a low temperature and enables the optical-electric properties to be easily controlled by changing the composition of cations and halogen anions. For this reason, the halide perovskite has the advantage of being able to easily change the physical properties of the material depending on the applications, so that the halide perovskite has been recognized to have sufficient potential as a material for next-generation power generation devices, and active research is being conducted thereon.

However, even though the halide perovskite is used, there is a limit in improving the performance of the power generation device through a change in its composition or a change in the structure of the device.

SUMMARY

An objective of the present disclosure is to provide a method of improving the performance of a power generation device without changing the composition of an active layer or the configuration of the device.

The above objective of the present disclosure can be achieved by a device manufacturing method and a power generation device that are described below.

According to one aspect of the present disclosure, there is provided a device manufacturing method including: (a) forming a halide perovskite active layer on a flexible substrate bent by applying a stress; and (b) releasing the stress applied to the substrate on which the halide perovskite active layer is formed, thereby unfolding the bent substrate. Here, the device may be a power generation device.

According to one embodiment of the present disclosure, the method further may further include: (i) applying a first perovskite precursor solution on the flexible substrate; and (ii) applying a stress to the substrate coated with the first perovskite precursor solution, thereby bending the substrate, steps (i) and (ii) being performed before step (a). Step (a) may be performed by treating the bent substrate with a second perovskite precursor solution to form a halide perovskite active layer.

According to another embodiment of the present disclosure, the first perovskite precursor solution may be represented by Formula $BX_2$, and the second perovskite precursor solution is represented by Formula AX, in which A is Rb, Cs, Fr, $CH_3NH_3^+$, $NR_4^+$ (wherein R is hydrogen or alkyl having 1 to 10 carbon atoms and R's are the same or different from each other), $[CH(NH_2)_2]^+$, or a combination thereof, B may be Pb, Sn, Bi, Ge, Ga, Ti, In, Sb, Mn, or a combination thereof, and X may be Cl, Br, I, or a combination thereof.

According to a further embodiment of the present disclosure, the flexible substrate bent by the stress applied thereto in step (a) is bent such that a surface on which the active layer is to be formed is concave, and in step (b), the halide perovskite active layer may be a photoelectric active layer.

According to a further embodiment of the present disclosure, the flexible substrate bent by the stress applied thereto in step (a) is bent such that a surface on which the active layer is to be formed is convex, and in step (b), the halide perovskite active layer may be a piezoelectric layer.

According to a yet further embodiment of the present disclosure, the method may further include poling the piezoelectric layer by applying an electric field to the piezoelectric layer.

According to a yet further embodiment of the present disclosure, the substrate is bent in step (a) such that when the substrate is unfolded in step (b), strain occurring in the active layer is within a range of +1.35% to more than 0% or in a range of less than 0% to −1.35%.

According to a yet further embodiment of the present disclosure, step (i) may be performed by spin coating, and step (a) may be performed by dip-coating.

According to another aspect of the present disclosure, there is provided a power generation device including: a flexible substrate; and an active layer formed on the flexible substrate, in which the active layer is a layer including halide perovskite and having a strain.

According to one embodiment of the present disclosure, the halide perovskite may be represented by the following Formula 1:

$$ABX_3 \qquad [\text{Formula 1}]$$

In Chemical Formula 1,
A is Rb, Cs, Fr, $CH_3NH_3^+$, $NR_4^+$ (wherein R is hydrogen or alkyl having 1 to 10 carbon atoms and Rs are the same or different from each other), $[CH(NH_2)_2]^+$, or a combination thereof,
B is Pb, Sn, Bi, Ge, Ga, Ti, In, Sb, Mn, or a combination thereof, and
X is Cl, Br, I, or a combination thereof.

According to another embodiment of the present disclosure, in Formula 1, A may be Cs, and B may be Pb.

According to a further embodiment of the present disclosure, the strain may be a tensile strain, and the active layer may be a photoelectric active layer.

According to a yet further embodiment of the present disclosure, the tensile strain may be within a range of +0.6% to +1.35%

According to a yet further embodiment of the present disclosure, the strain may be a compressive strain, and the active layer may be a piezoelectric layer.

According to a yet further embodiment of the present disclosure, the compressive strain may be within a range of −0.6% to −1.35%

According to a yet further embodiment of the present disclosure, the active layer may include the halide perovskite in the form of a thin film.

According to a further aspect of the present disclosure, there is provided a photodetector including: a flexible substrate; and a photoelectric active layer formed on the flexible substrate, in which the photoelectric active layer is a layer including halide perovskite and having a tensile strain.

According to one embodiment of the present disclosure, the photodetector may have a responsivity (R) of 50 mA/W or more at a light intensity in a range of 0.35 to 0.55 mW/cm$^2$.

According to a yet further aspect of the present disclosure, there is provided a piezoelectric device including: a flexible substrate; and a piezoelectric layer formed on the flexible substrate, in which the piezoelectric layer is a layer including halide perovskite and having a compressive strain.

According to one embodiment of the present disclosure, the compressive strain is in a range of −0.6% to −1.35%, and the fracture energy determined through a bending fracture evaluation is increased by at least 25% or more compared to a case where the compressive strain is 0%.

Since the power generation device according to the present disclosure is manufactured by forming a halide perovskite active layer on a flexible substrate that is bent to be in a deformed state. Therefore, strain is present on the active layer after the flexible substrate recovers from the deformation. As such, the power generation device of the present disclosure includes an active layer in which a strain is present. Therefore, performance can be improved without changing the composition of the active layer or modifying the construction of the device. For example, in the case of a photoelectric device, photoelectric performance such as sensitivity, reaction rate, efficiency, etc., is improved. On the other hand, in the case of a piezoelectric device, performance such as piezoelectric voltage, piezoelectric current, mechanical strength against bending, and mechanical flexibility can be improved.

In addition, it is difficult to apply the flexible substrate to a high-temperature deposition process. Since halide perovskite can be formed at a low temperature of 100° C. or less, it can be advantageously used in manufacturing a device using a flexible substrate, and furthermore, the device can be conveniently manufactured by a solution process.

BRIEF DESCRIPTION OF DRAWINGS

FIGS. 12A to 12D show the piezoelectric characteristics of a CsPbBr$_3$ thin film with an in-situ strain, in which FIG. 12A is a piezoresponse force microscope (PFM) image, FIG. 12B shows the distribution of PR amplitudes, FIG. 12C shows an amplitude according to a bias voltage, and FIG. 12D shows effective piezoelectric coefficients $d_{33,eff}$ according to an in-situ strain;

DETAILED DESCRIPTION

Figure 1:
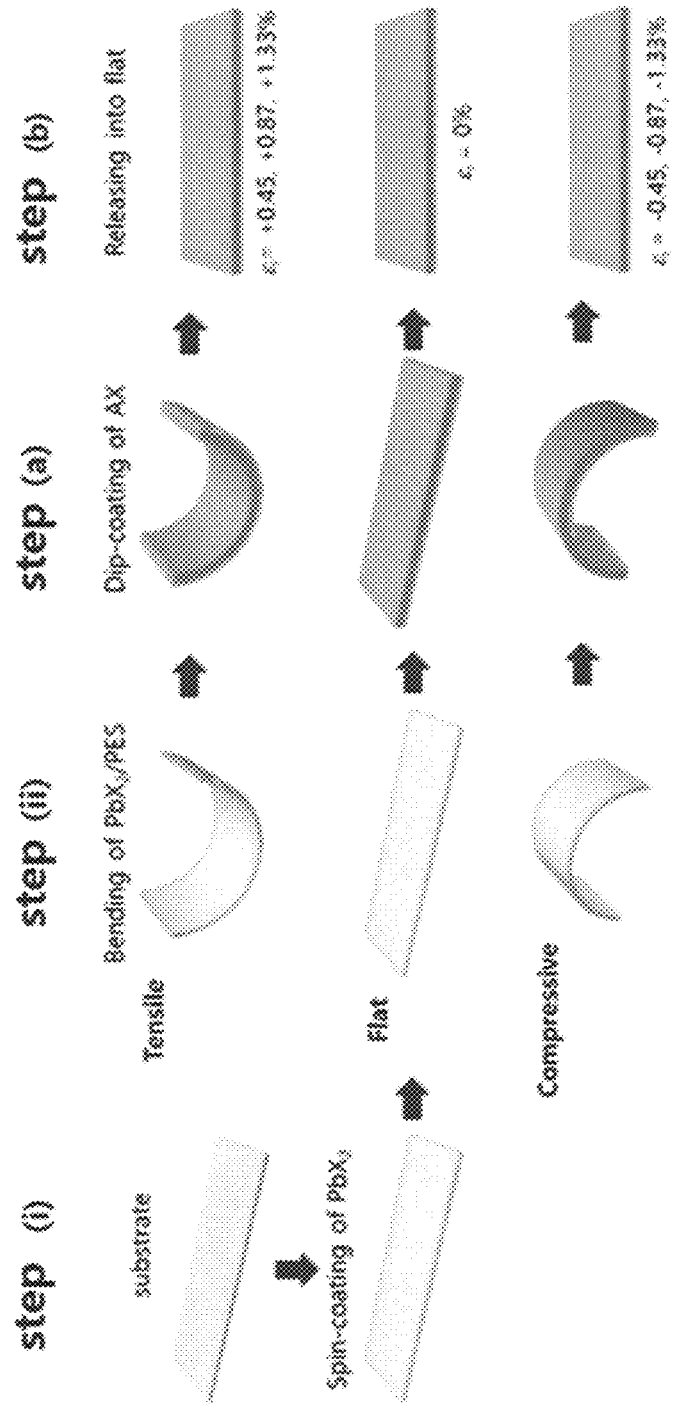
FIG. 1 is a schematic view illustrating a device manufacturing method according to one embodiment of the present disclosure.

Hereinafter, the present disclosure will be described in detail.

The terminology used herein is for the purpose of describing particular embodiments only and is not intended to be limiting. In addition, unless otherwise defined, all terms including technical and scientific terms used herein have the same meaning as commonly understood by those who are ordinarily skilled in the art to which this disclosure belongs.

Throughout the present description, when a component "comprises", "includes", "contains", or "has" a certain element, it means that other elements may be further included in the component unless otherwise defined.

In addition, as used herein, the term "and/or" includes any one and any combination of one or more of the listed items.

In addition, in the description with reference to the accompanying drawings, the same components are given the same reference numerals, and the overlapping description thereof will be omitted. In the drawings, for example, the size and shape of members may be exaggerated for convenience and for clarity of description, and in actual implementation, variations of the illustrated shape may be expected. Accordingly, embodiments of the present disclosure should not be construed as being limited to the specific shapes of regions shown herein.

Further, it will be understood that, although the terms "first," "second," etc. may be used herein to describe various elements, and these elements should not be limited by these terms.

When a first portion, such as a layer, film, etc., is described to be "on" or "on an upper side of" a second portion, it means not only the case where the first portion is "directly on" or "directly on an upper side of" the second portion and thus the first portion and the second portion are in contact with each other but also the case where a third portion exists between the first part and the second part. However, when a first portion is described to be "directly on" or "directly on an upper side of" a second portion, it means that there is no other portion between the first portion and the second portion.

Hereinafter, a power generation device according to an embodiment of the present disclosure will be first described.

FIG. 1 is a schematic view illustrating a device manufacturing method according to one embodiment of the present disclosure.

According to one aspect of the present disclosure, a power generation device may be manufactured by a method including the steps of: (a) forming a halide perovskite active layer on a flexible substrate bent by a stress applied thereto; and (b) releasing the stress applied to the substrate on which the halide perovskite active layer is formed so that the bent substrate is unfolded.

According to one embodiment of the present disclosure, a power generation device may be manufactured by a method including the steps of: (i) applying a first perovskite precursor solution on a flexible substrate; (ii) bending the flexible substrate coated with the first perovskite precursor solution by applying a stress to the flexible substrate; (a) treating the bent substrate with a second perovskite precursor solution to form a halide perovskite active layer; and (b) releasing the stress applied to the substrate on which the halide perovskite active layer is formed so that the bent substrate is unfolded.

According to another embodiment of the present disclosure, a power generation device may be manufactured by a method including the steps of: (0) forming a first electrode on a flexible substrate (not illustrated); (i) applying a first perovskite precursor solution on the first electrode; (ii) bending the flexible substrate coated with the first perovskite precursor solution by applying a stress to the flexible substrate; (a) treating the bent substrate with a second perovskite precursor solution to form a halide perovskite active layer; (b) releasing the stress applied to the substrate on which the halide perovskite active layer is formed so that the bent substrate is unfolded; and (c) forming a second electrode on the halide perovskite active layer of the stretched substrate (not shown).

In steps (0) and (c), the first electrode and the second electrode may be formed using a conventional technique commonly used in the art, and specifically, may be formed by thermal evaporation or sputtering under vacuum.

The precursor of the first perovskite precursor solution in step (i) may be a material having Formula $BX_2$, in which B and X in Formula $BX_2$ are defined in the same manner as in Formula 1. For example, the first perovskite precursor may be $PbX_2$, in which X is Cl, Br, or I. The applying of the first perovskite precursor solution may be performed by a solution process. Specifically, after preparing a solution by dissolving a first perovskite precursor in a solvent, the substrate is coated with the solution by spin coating, spray coating, screen printing, bar coating, inkjet printing, slot die coating, or the like. More specifically, the first perovskite precursor solution may be coated on the substrate by a spin coating process, and the speed and time of the spin coating process may be appropriately determined by those skilled in the art, depending on the target thickness and thin film uniformity of a formed photoactive layer.

After applying the first perovskite precursor on the substrate as described above, a predetermined heat treatment, for example, annealing may be performed. The formed first perovskite precursor layer is crystallized by this heat treatment, thereby forming a thin film having a uniform surface and flat structure.

Step (ii) may be performed by bending the substrate so that the substrate surface coated with the first perovskite precursor solution becomes concave- or convex-curved. When the substrate is bent to be concave, as will be described later, the halide perovskite active layer has a tensile strain when the substrate is unfolded and thus the halide perovskite active layer becomes a photoelectric active layer, resulting in formation of a photoelectric device. When the substrate is bent to be convex, as will be described later, the halide perovskite active layer has a compressive strain when the substrate is unfolded and thus the halide perovskite active layer becomes a piezoelectric layer, resulting in formation of a piezoelectric device. At this time, the level of stress applied to the substrate and the strain level of the active layer may vary depending on the degree of bending of the substrate, specifically, the radius of curvature of the substrate. For example, when the radius of curvature of the bent substrate is 7.5 mm in the power generation device to be described later, the strain may be approximately 1.33%. When the radius of curvature is 22.3%, the strain may be 0.45%. According to one embodiment of the present disclosure, by controlling the degree of bending, the strain of the active layer may be controlled to be in a range of from +1.35% to more than 0% or in a range of from less than 0% to −1.35%. The radius of curvature may be calculated by the relation "$\pi r=L$" (r: radius of curvature, L: substrate length). The stress applied to the substrate may be calculated using Equation 1 below.

$$\varepsilon_p = \left(\frac{t_f + t_s}{2r}\right)\frac{(1 + 2\eta + x\eta^2)}{(1 + \eta)(1 + x\eta)} \qquad \text{[Equation 1]}$$

In Equation 1, $t_f$ is the thickness of the active layer, $t_s$ is the thickness of the substrate, $\eta=t_f/t_s$, $\chi=E_f/E_s$, and r is the radius of curvature of the center of the substrate. Ef is the Young's modulus of the active layer, and Es is the Young's modulus of the substrate.

The second perovskite precursor in step (a) may be a material having Formula AX. In Formula AX, A and X in Formula A and X are defined in the same manner as in Formula 1. For example, the second perovskite precursor may be CsX, $CH_3NH_3X$, or $[CH(NH_2)_2]X$, where X is Cl, Br, or I. The coating with the second perovskite precursor solution may be performed by a solution process, for example, dip-coating. Specifically, the second perovskite precursor is dissolved in a solvent to prepare a solution, and the substrate obtained in the deformed state of step (ii) described above may be immersed in the second perovskite precursor solution. The substrate used in step (a) is in a deformed state resulting from step (ii) in which stress is applied to the substrate to be deformed. The precursor having Formula $BX_2$ coated on the substrate and the precursor having Formula AX in the second perovskite precursor solution react so that a halide perovskite layer having Formula 1 is formed. A person skilled in the art may appropriately adjust the immersion time and the speed of taking out the substrate according to the degree of film formation, the desired film thickness, and the like.

Step (b) is a step of releasing the stress applied to the substrate on which the halide perovskite layer is formed in step (a). In step (a), since the halide perovskite layer is formed on the substrate deformed by the stress applied thereto, when the stress is released in the step (b), in-situ strain is present in the halide perovskite layer. The degree of strain will depend on the level of stress applied to the substrate, i.e., the degree of bending of the substrate. In addition, the type of strain (i.e., tensile strain or compressive strain) will vary depending on the direction in which the substrate is bent (i.e., concave or convex). In the case of the piezoelectric device, by additionally performing after performing a step of applying an electric field to the halide perovskite active layer after step (b), the piezoelectric performance may be improved.

Figure 2:
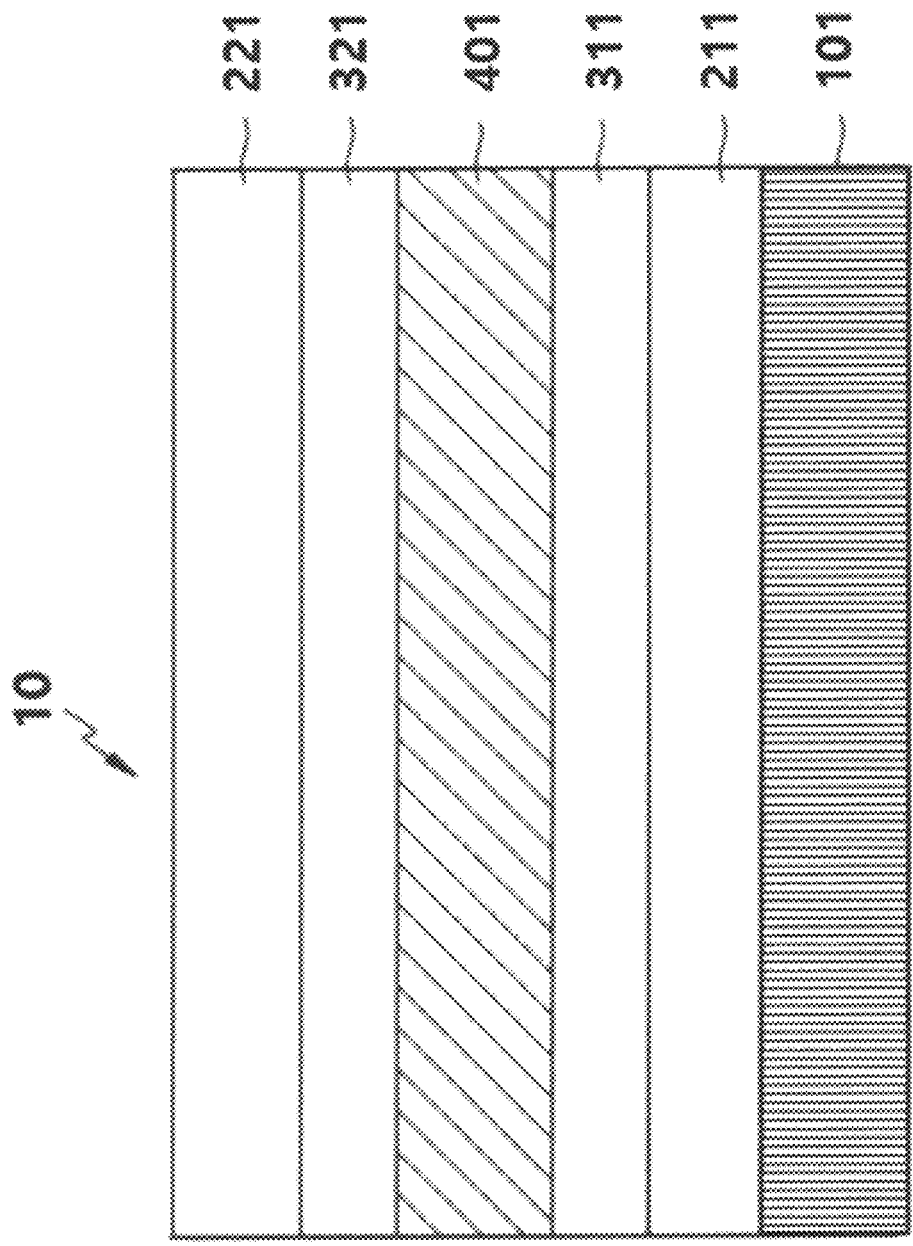
FIG. 2 is a cross-sectional view illustrating of an optoelectronic device according to one embodiment of the present disclosure.
Figure 3:
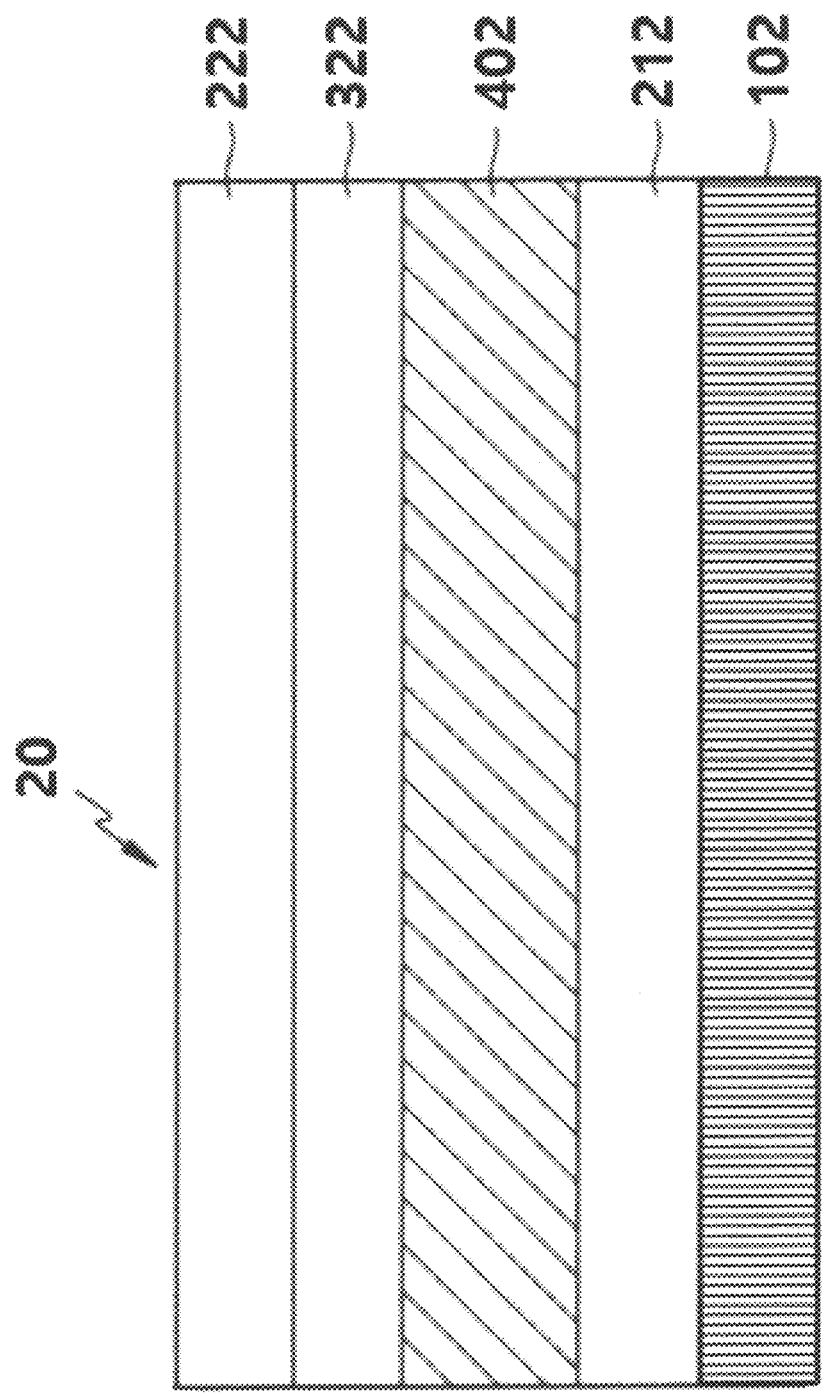
FIG. 3 is a cross-sectional view illustrating a piezoelectric device according to one embodiment of the disclosure.

Next, a power generation device will be described with reference to FIGS. 2 and 3.

According to one embodiment of the present disclosure, a power generation device 10 (or 20) includes a flexible substrate 101 (or 102) and an active layer 401 (or 402) disposed on the flexible substrate 101 (or 102), in which the active layer 401 (or 402) is a layer including halide perovskite and having strain.

The flexible substrates 101 and 102 are made of a material that can be deformed by stress. The material of the flexible substrates 101 and 102 is not particularly limited if it can be used to manufacture the power generation devices 10 and 20 such as an optoelectronic device 10 or a piezoelectric device 20. The material may be at least one selected from the group consisting of polydimethylsiloxane (PDMS), polyimide (PI), polyethylene terephthalate (PET), polyethylene naphthalate (PEN), polyurethane (PU), polycarbonate (PC), and Ecoflex™.

According to the present disclosure, the active layers 401 and 402 contain halide perovskite represented by the following Formula 1:

$$ABX_3 \qquad \text{[Formula 1]}$$

In Formula 1, A is Rb, Cs, Fr, $CH_3NH_3^+$, $NR_4$ (wherein R is hydrogen or alkyl having 1 to 10 carbon atoms, and R is the same or different from each other), $[CH(NH_2)_2]^+$, or a combination thereof. Specifically, A is Cs, $CH_3NH_3^+$, or $[CH(NH_2)_2]^+$.

In Formula 1, B is Pb, Sn, Bi, Ge, Ga, Ti, In, Sb, Mn, or a combination thereof. Specifically, B is Pb. Alternatively, B is a combination of Pb and at least one selected from the group consisting of Sn, Bi, Ge, Ga, Ti, In, Sb, and Mn. More specifically, B may be Pb.

In Formula 1, X is Cl, Br, I, or a combination thereof and, specifically, may be Cl, Br, or I.

According to an embodiment of the present disclosure, the perovskite of Formula 1 may be $CsPbX_3$. Here, X is as defined in Formula 1 and, specifically, may be Cl, Br, or I.

According to another embodiment of the present disclosure, in the perovskite of Formula 1, A may be $CH_3NH_3^+$ or $[CH(NH_2)_2]^+$, B may be Pb, and X may be Cl, Br, or I.

According to one embodiment of the present disclosure, the halide perovskite of Formula 1 may be in a thin film form, but in some cases, the halide perovskite of Formula 1 may be in another form such as a single crystal or a nanowire.

According to one embodiment of the present disclosure, the power generation device may be an optoelectronic device 10.

According to one embodiment of the present disclosure, the optoelectronic device 10 includes a flexible substrate 101 and a photoactive layer 401 disposed on the flexible substrate 101. The photoactive layer 401 is a layer containing halide perovskite and having tensile strain.

According to one embodiment of the present disclosure, the optoelectronic device 10 includes: a flexible substrate 101; a first electrode 211 disposed on the flexible substrate 101; a second electrode 221 facing the first electrode 211; and a photoactive layer 401 interposed between the first electrode 211 and the second electrode 221. The photoactive layer 401 is a layer comprising halide perovskite and having a tensile strain.

According to one embodiment of the present disclosure, the optoelectronic device 10 may further include a hole transport layer 311 and/or an electron transport layer 321 in addition to the photoactive layer 401.

According to one embodiment, the first electrode 211 may include a metal, a metal oxide, or a combination thereof. The metal of the first electrode 211 may be, for example, selected from aluminum (Al), silver (Ag), gold (Au), palladium (Pd), platinum (Pt), and alloys thereof. The metal oxide may be selected from indium tin oxide (ITO), indium zinc oxide (IZO), zinc oxide (ZnO), tin oxide (SnO), aluminum tin oxide (ZITO), aluminum zinc oxide (AZO), and fluorine-doped tin oxide (FTO).

According to one embodiment, the second electrode 221 may include a metal, a metal oxide, or a combination thereof. The metal of the second electrode 221 may be, for example, selected from aluminum (Al), silver (Ag), gold (Au), palladium (Pd), platinum (Pt), and alloys thereof. Examples of the metal oxide include indium tin oxide (ITO), indium zinc oxide (IZO), zinc oxide (ZnO), tin oxide (SnO), aluminum tin oxide (ZITO), aluminum zinc oxide (AZO), fluorine-doped tin oxide (FTO), molybdenum oxide, tungsten oxide, nickel oxide, copper oxide, cobalt oxide, manganese oxide, vanadium oxide, rhenium oxide, niobium oxide, chromium oxide, indium oxide, and combinations thereof. Alternatively, the second electrode 221 may be made of a material selected from lithium fluoride/aluminum (LiF/Al), lithium fluoride/silver (LiF/Ag), cobalt sulfide (CoS), copper sulfide (CuS), carbon nanotubes, and graphene.

The hole transport layer 311 may be formed between the first electrode 211 and the photoactive layer 401. The hole transport layer 311 is a layer for effectively moving holes to the photoactive layer 401. The hole transport layer 311 may include, for example, at least one selected from thiophene-based, para-phenylenevinylene-based, carbazole-based, and triphenylamine-based materials, but is not limited thereto. Specifically, the hole transport layer 311 is made of at least one material selected from the group consisting of poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]

biphenyl(α-NPD), m-MTDATA, 4,4',4"-tris(N-carbazolyl)-triphenylamine (TCTA), tungsten oxide, molybdenum oxide, vanadium oxide, rhenium oxide, nickel oxide, copper oxide, titanium oxide, molybdenum sulfide, and combinations thereof.

The hole transport layer 321 may be formed between the photoactive layer 401 and the second electrode 221. The electron transport layer 321 is a layer for smoothly moving electrons generated in the photoactive layer 401 to the second electrode 221, thereby reducing a dark current. The electron transport layer 321 is a layer including, for example, at least one selected from the group consisting of (6,6)-phenyl-C61-butyric acid-methyl ester (PCBM), (6,6)-phenyl-C61-butyric acid-cholesteryl ester (PCBCR), 1,4,5,8-naphthalene-tetracarboxylic dianhydride (NTCDA), vasocuproin (BCP), LiF, $Alq_3$, $Gaq_3$, $Inq_3$, $Znq_2$, $Zn(BTZ)_2$, $BeBq_2$, aluminum (Al), aluminum oxide, magnesium (Mg), magnesium oxide, molybdenum (Mo), molybdenum oxide, and combinations thereof.

The optoelectronic device 10 may include layers such as a hole injection layer, an electron injection layer, and a buffer layer, in addition to or instead of the hole transport layer 311 and the electron transport layer 321.

The optoelectronic device 10 of the present disclosure may be applied to a solar cell, an optical sensor, an image sensor, a photodetector, and the like. Specifically, the optoelectronic device of the present disclosure may be a photodetector such as a self-powered photodetector.

Responsivity (R) may be used as a criterion for determining the sensitivity of the optoelectronic device. As can be seen from examples described below, according to the present disclosure, reactivity can be significantly improved compared to the case where there is no tensile strain (0%) or there is a compressive strain (less than 0% strain) because strain greater than 0% exists in the photoactive layer. Even the optoelectronic device of the present disclosure may be a self-powered photodetector that operates even at 0V. According to one embodiment of the present disclosure, the optoelectronic device of the present disclosure has a responsivity of 50 mA/W or more, or 70 mA/W or more, or 110 mA/W or more at a light intensity of 0.35 to 0.55 mA/W. Accordingly, the optoelectronic device according to the present disclosure has a high responsivity and can react very sensitively even to a minute light intensity.

According to one embodiment of the present disclosure, the power generation device may be a piezoelectric device 20.

According to one embodiment of the present disclosure, the piezoelectric device 20 includes a flexible substrate 102 and a piezoelectric layer 402 disposed on the flexible substrate 102. The piezoelectric layer 402 is a layer containing halide perovskite and having compressive strain.

According to one embodiment of the present disclosure, the piezoelectric device 20 includes: a flexible substrate 102; a first electrode 212 disposed on the flexible substrate 102; a second electrode 222 facing the first electrode 212; and a piezoelectric layer 402 interposed between the first electrode 212 and the second electrode 222. The piezoelectric layer 402 is a layer containing halide perovskite and having a compressive strain.

According to one embodiment of the present disclosure, the piezoelectric device 20 may additionally include a passivation layer 322 in addition to the piezoelectric layer 402.

The piezoelectric layer 402 may be polled by an electric field applied thereto. Before poling the piezoelectric layer 402, dipoles of the piezoelectric layer may be arranged to be irregularly orientated. When an electric field is applied from the outside, the dipoles of the piezoelectric layer may be aligned in a predetermined direction and poled. For example, when a positive voltage is applied to the second electrode and a negative voltage is applied to the first electrode, in the dipoles, a portion charged with − is oriented toward the second electrode, and a portion charged with + is oriented toward the first electrode. When the dipoles are aligned in a predetermined direction in this way, the piezoelectric value of the piezoelectric layer may be increased compared to the case where the poling is not yet performed.

In the piezoelectric device 20, as the flexible substrate 102, the first electrode 212, and the second electrode 222, those listed in the description of the optoelectronic device 10 may be used.

In addition, the piezoelectric device 20 may further include a passivation layer 332 disposed between the first electrode 212 and the piezoelectric layer 402 or between the second electrode 222 and the piezoelectric layer 402 to protect the piezoelectric layer 402. The passivation layer 322 may include, for example, at least one selected from polyvinyl chloride (PVC), Neoprene, polyvinyl alcohol (PVA), poly methyl meta acrylate (PMMA), poly benzyl meta acrylate (PBMA), polystyrene, polydimethylsiloxane (PDMS), and polyvinyl formal (PVFM).

Hereinafter, specific examples of the present disclosure are described. However, the examples presented below are only for specifically illustrating or describing the present disclosure, and the present disclosure is not limited thereto.

—Photodetector—

Preparation Example 1

Fabrication of Photodetector

An ITO-coated polyethylene naphthalate (PEN) substrate (20 mm×25 mm) was sonicated in an isopropyl alcohol bath for 10 minutes and then subjected to oxygen plasma treatment for 5 minutes to obtain a surface-treated substrate. An aqueous solution of poly(3,4-ethylenedioxythiophene)-poly (styrenesulfonate (PEDOT:PSS, Al 4083, Heraeus, Germany) was spin-coated on the surface-treated substrate at 3,000 rpm for 60 seconds and dried at 75° C. for 20 minutes to form a hole transport layer. $PbBr_2$ (99.99%, TCI, Japan) was dissolved in N,N-dimethylformamide (DMF<anhydrous, 99.8%, Sigma-Aldrich Inc., USA) at a concentration of 367 mg/ml and stirred at room temperature for 5 hours. CsBr (99.9%, TCI, Japan) was separately dissolved in anhydrous methanol (anhydrous, Daejung, Korea) at a concentration of 15 mg/ml. A $PbBr_2$ solution was spin-coated on a PEDOT:PSS/ITO/PEN substrate at 3,500 rpm for 30 seconds and then annealed at 75° C. for 15 minutes. Next, the annealed $PbBr_2$/PEDOT:PSS/ITO/PEN was uniaxially bent to be convex or concave with a predetermined radius of curvature. The resulting $PbBr_2$ film which was bent was immersed in a CsBr solution at 50° C. for 15 minutes to form a perovskite thin film. The perovskite thin film thus formed through two steps was rinsed with IPA and dried again at 50° C. in an oven for 10 minutes. The stress applied to the $CsPbBr_3$ film was removed so that the substrate returns to the original flat state. The radius of curvature was adjusted to produce different uniaxial strains $\varepsilon_i$ of −0.83%, −0.54%, 0%, +0.54%, and +0.83% in the final perovskite thin film. After diluting a solution of phenyl-C61-butyric acid methyl ester (PCBM, 99.5%, Nano-C Inc, USA) with 1,2-dichlorobenzene (Sigma-Aldrich Inc., USA) to becomes a concentration of 2%, the stress was released.

After releasing the stress, the diluted solution was spin-coated on the perovskite thin film at 1,250 rpm for 60 seconds. An Ag (100 nm)/LiF (1 nm) two-layer upper electrode was deposited using a thermal evaporator in an Ar-filled glove box, so that an Ag:LiF/PCBM/CsPbBr$_3$/PEDOT:PSS/ITO/PEN structure was obtained.

Figure 4:
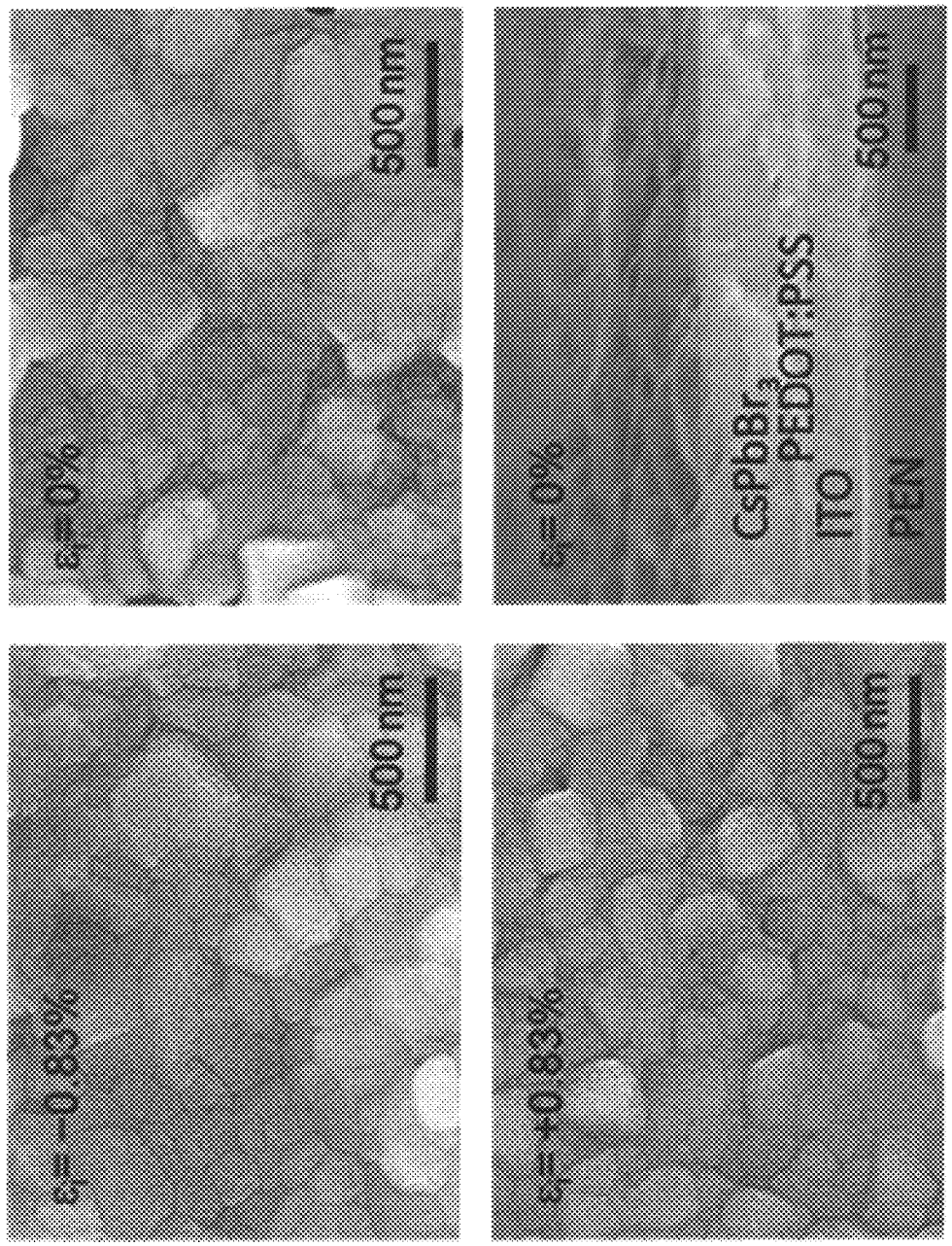
FIG. 4 is an FE-SEM image showing the surface and cross-sectional microstructure of a perovskite thin film layer of a photodetector prepared in Preparation Example.
Figure 5A:
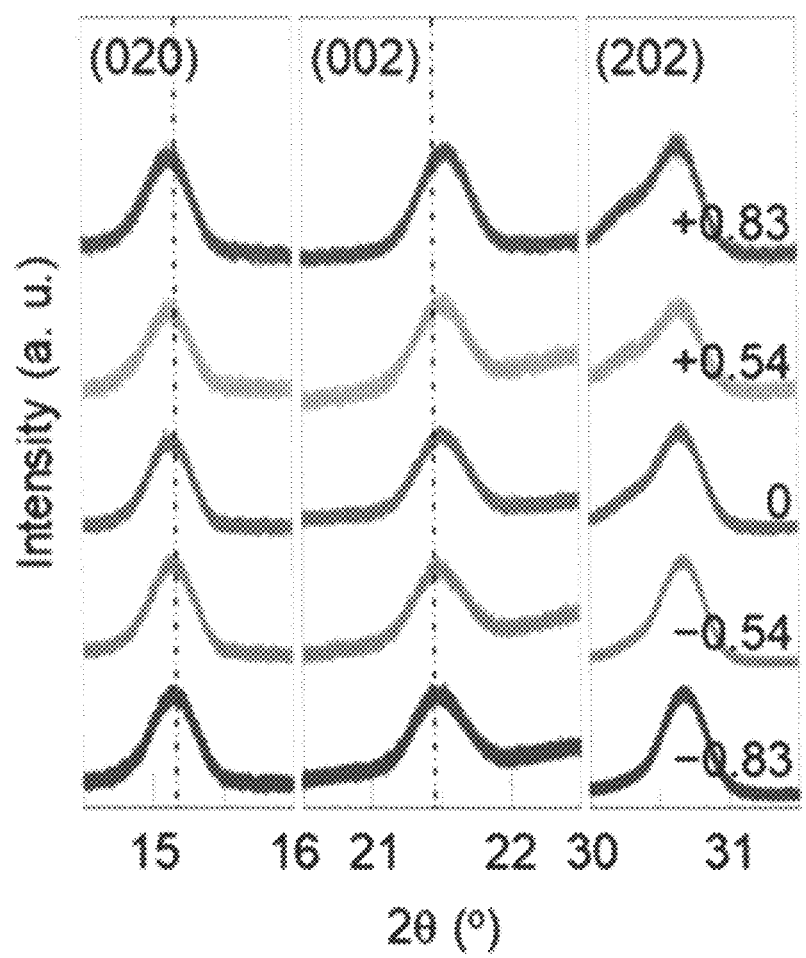
FIGS. 5A and 5B show the results of examining the crystal structure of the perovskite thin film layer of the photodetector prepared in Preparation Example using a high-resolution X-ray diffractometer.
Figure 5B:
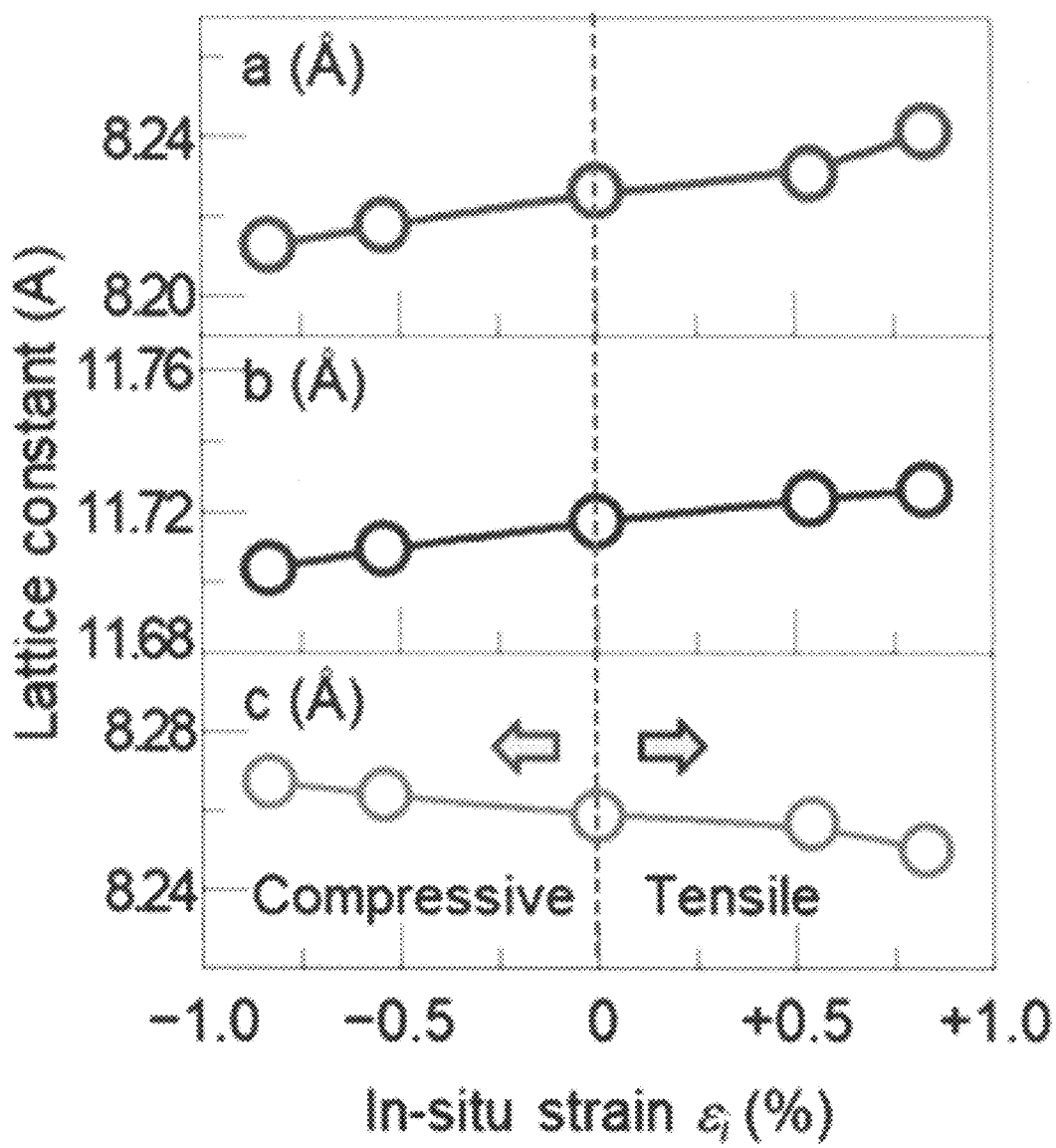

The surface and cross-sectional microstructures of the prepared CsPbBr$_3$ thin film were observed with FE-SEM (JSM 7601F, JEOL, Japan), and the results are shown in FIG. 4. In addition, the crystal structure was examined with a high-resolution X-ray diffractometer (HR-XRD, Smart-Lab, Rigaku, Japan), and the results are shown in FIG. 5. FIG. 5A shows that the orthorhombic perovskite structure is maintained regardless of the presence of compressive strain or tensile strain. FIG. 5B shows that the in-plane lattice constants a and b slightly increase with the presence and increase of tensile strain, whereas the out-of-plane constant c decreases. In conclusion, it is seen that the volume of the unit cell increases as the in-situ strain changes from the compressive strain to the tensile strain.

Evaluation Example 1

Evaluation of Photoreactivity According to ON/OFF Switching Repetition

The photodetector prepared in Preparation Example was used. Without applying an external bias voltage, the ON/OFF switching was repeated such that the ON state for 10 seconds in the wavelength range of 350 to 800 nm under a light intensity of 1.52 mW/cm$^2$ and then the photodetector was switched to the OFF state. The photocurrent was measured over time along with the progress of the ON/OFF cycle, and the result is shown as a graph in FIG. 6.

Figure 6:
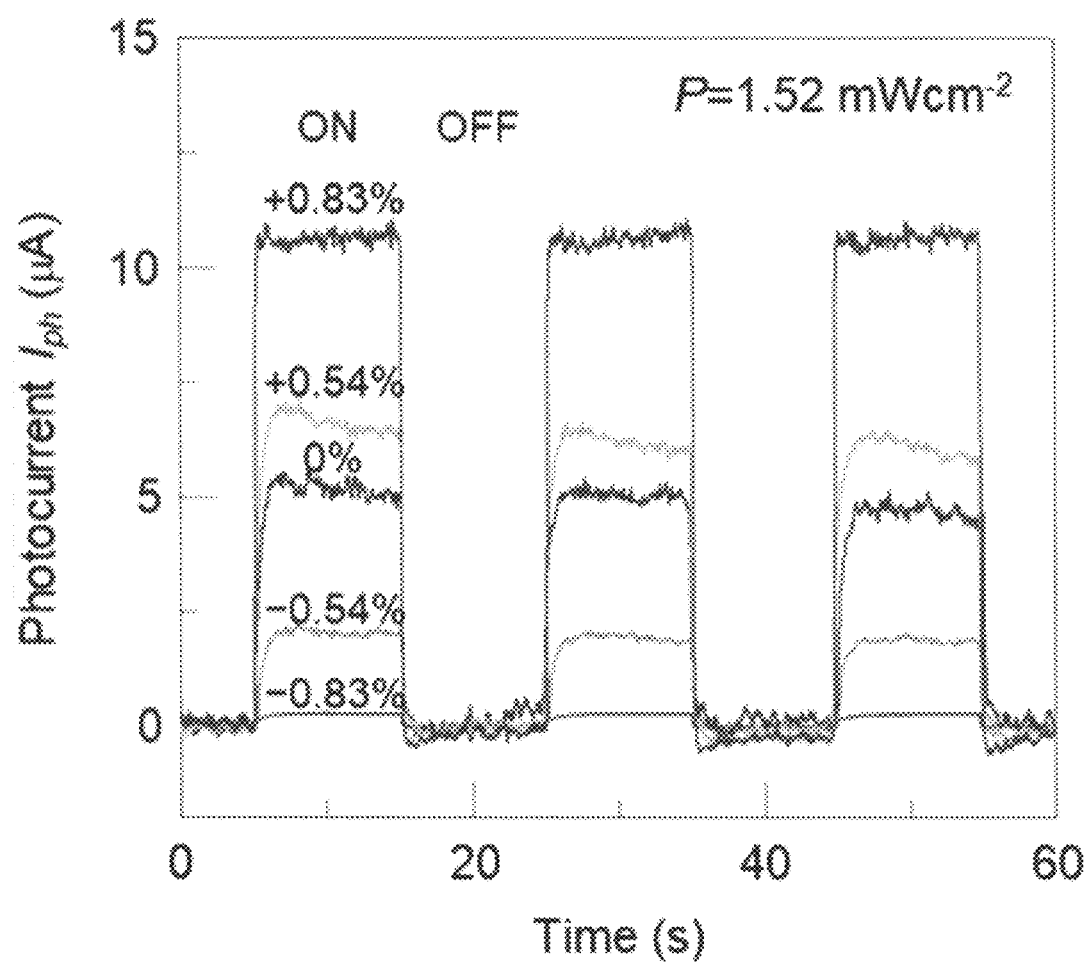
FIG. 6 is a graph illustrating change in photocurrent with time when ON/OFF switching is repeated.

As can be seen from FIG. 6, the photodetector of the present disclosure exhibited clear photoreactivity even without a driving voltage. This indicates that the photodetector operates by self-generation due to the additional potential induced by the ferroelectricity of the perovskite. It is seen that the photocurrent level in the ON state is highly dependent on the in-situ compressive or tensile strain. The sample without strain (0%) exhibited a photocurrent of approximately 5.46 μA while the sample with a tensile strain of +0.83% exhibited an increased photocurrent of about 10.83 μA. That means an increase of 98% in the photocurrent. The sample with a strain of −0.83% exhibited a reduced photocurrent of about 0.27 μA.

Evaluation Example 2

Photocurrent Change According to Light Intensity

Figure 7:
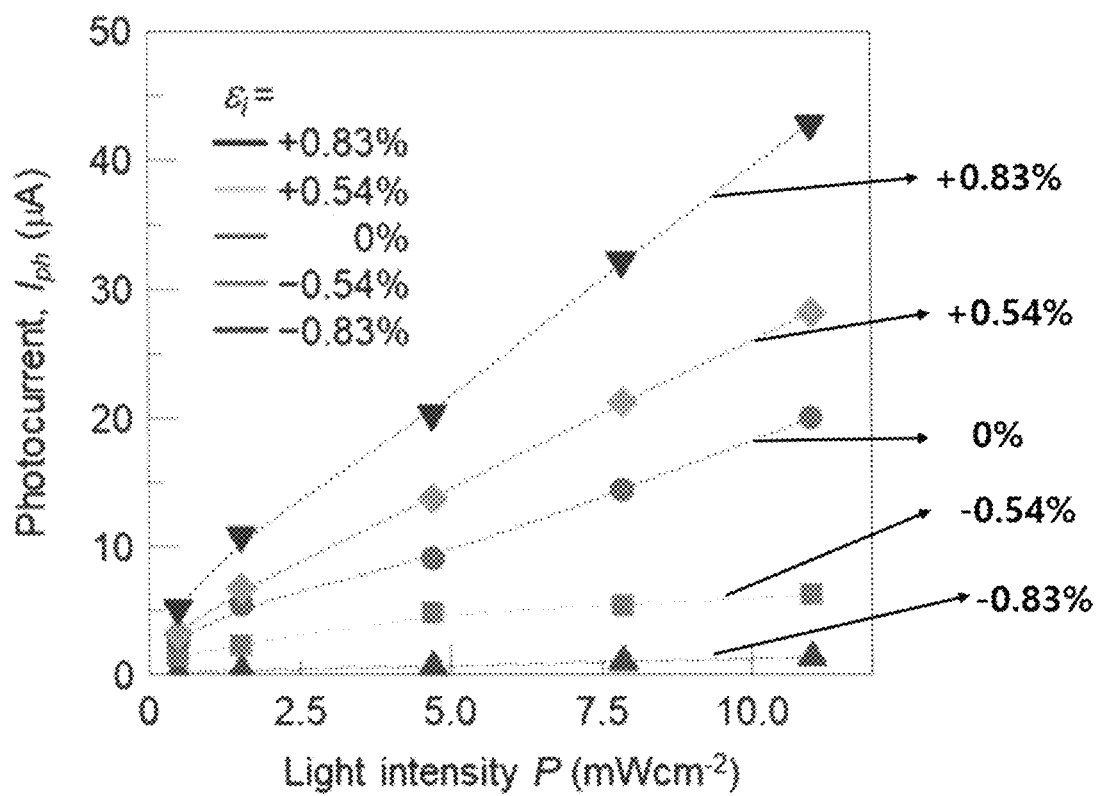
FIG. 7 is a graph illustrating change in photocurrent with light intensity.

When the photosensitivity P was changed from about 0.47 μW/cm$^2$ to 11.0 μW/cm$^2$ using the photodetector prepared in Preparation Example, the photocurrent $I_{ph}$ according to the light intensity was calculated. The calculation results are shown as a graph in FIG. 7. According to the graph of FIG. 7, with increase in the tensile strain, the light intensity increased and the photocurrent more sensitively increased, with increase in the tensile strain. In the case of +0.83% tensile strain, the photocurrent reached approximately 42.79 μA at 11.0 μW/cm$^2$.

Evaluation Example 3

Reaction Rate

Figure 8:
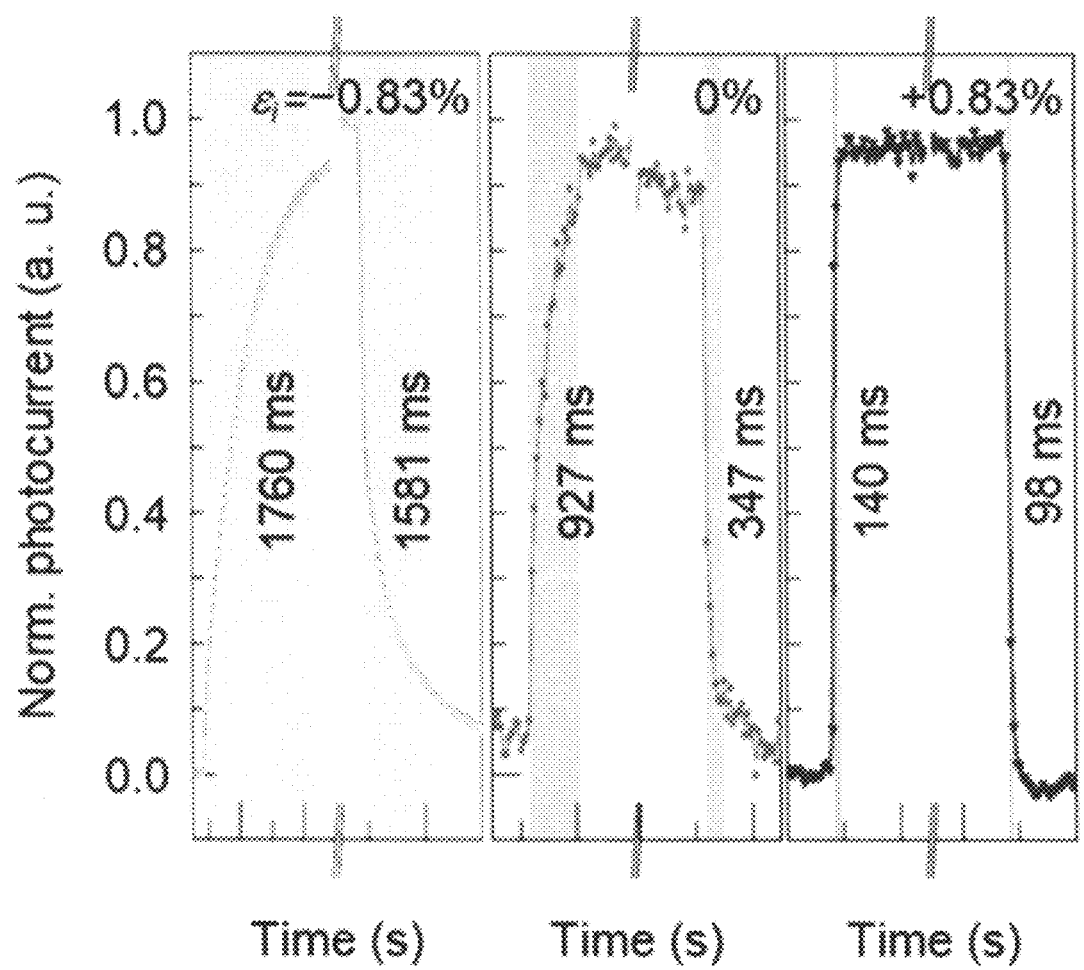
FIG. 8 shows a rise time ($\tau r$) and a decay time ($\tau d$) in a photodetector.

The photodetector prepared in Preparation Example was used. After normalizing the photocurrent curve shown in FIG. 6, the rise time $\tau_r$ and the decay time $\tau_d$ were obtained from the −0.83%, 0%, and +0.83% strained photodetectors. The result is shown in FIG. 8. The rise (or decay) time is the time that takes for the response to reach 90% (or 10%) of the peak value of the photocurrent when the response rises (or decays). The +0.83% strained photodetector showed the fastest response with a rise time of 140 ms and a decay time of 98 ms. This means that tensile strain prevented carrier recombination and improved carrier lifetime, resulting in more efficient charge extraction.

Evaluation Example 4

Responsivity (R)

Figure 9:
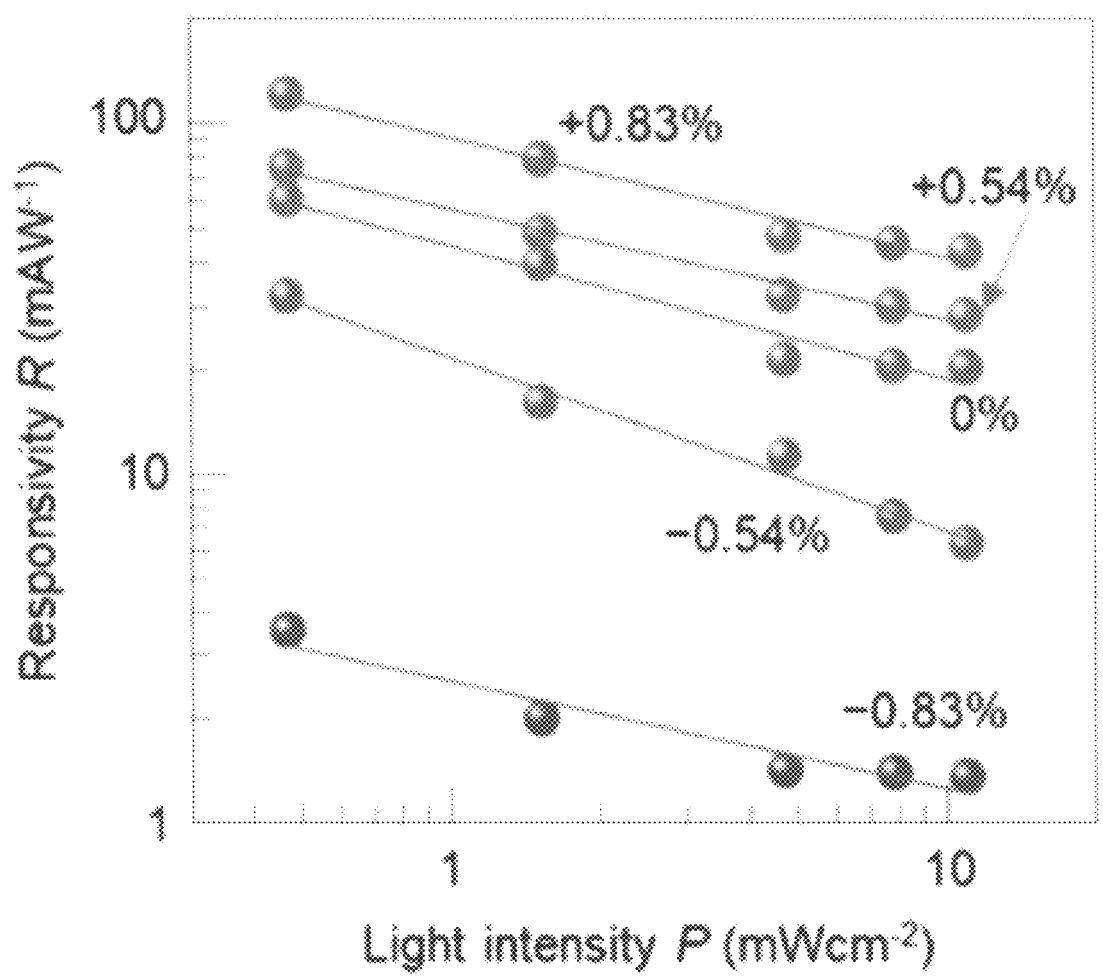
FIG. 9 is a graph showing responsivity (R) to light intensity (P)

Responsivity (R) represents the degree of photoresponse to light intensity (P) and is shown in FIG. 9 and the table below. As can be seen from FIG. 9, the R value increased with change in in-situ strain from the compressive strain to the tensile strain. For example, in Table 1 below, a maximum responsivity R of approximately 121.5 mA/W was achieved with a photocurrent of 5.15 μA at a light intensity of 0.47 mW/cm$^2$ for the +0.83% strained device. The R value was improved by about 100% compared to a responsivity 60.8 mA/W obtained under the same conditions in the 0% strained device.

TABLE 1

| Material | Thickness | Device structure | Substrate | Bias voltage (V) | P (mA/cm$^2$) | R (mA/W) |
|---|---|---|---|---|---|---|
| CsPbBr$_3$ (thin film) | 500 nm | Ag:LiF/PCBM/+0.83%-CsPbBr$_3$/PEDOT:PSS/ITO | PEN | 0 | 0.47 | 121.5 |
| CsPbBr$_3$ (thin film) | 500 nm | Ag:LiF/PCBM/0%-CsPbBr$_3$/PEDOT:PSS/ITO | PEN | 0 | 0.47 | 60.8 |
| CsPbBr$_3$ (thin film) | 500 nm | Ag:LiF/PCBM/−0.83%-CsPbBr$_3$/PEDOT:PSS/ITO | PEN | 0 | 0.47 | 3.6 |

Evaluation Example 5

Detectivity (D*)

Figure 10:
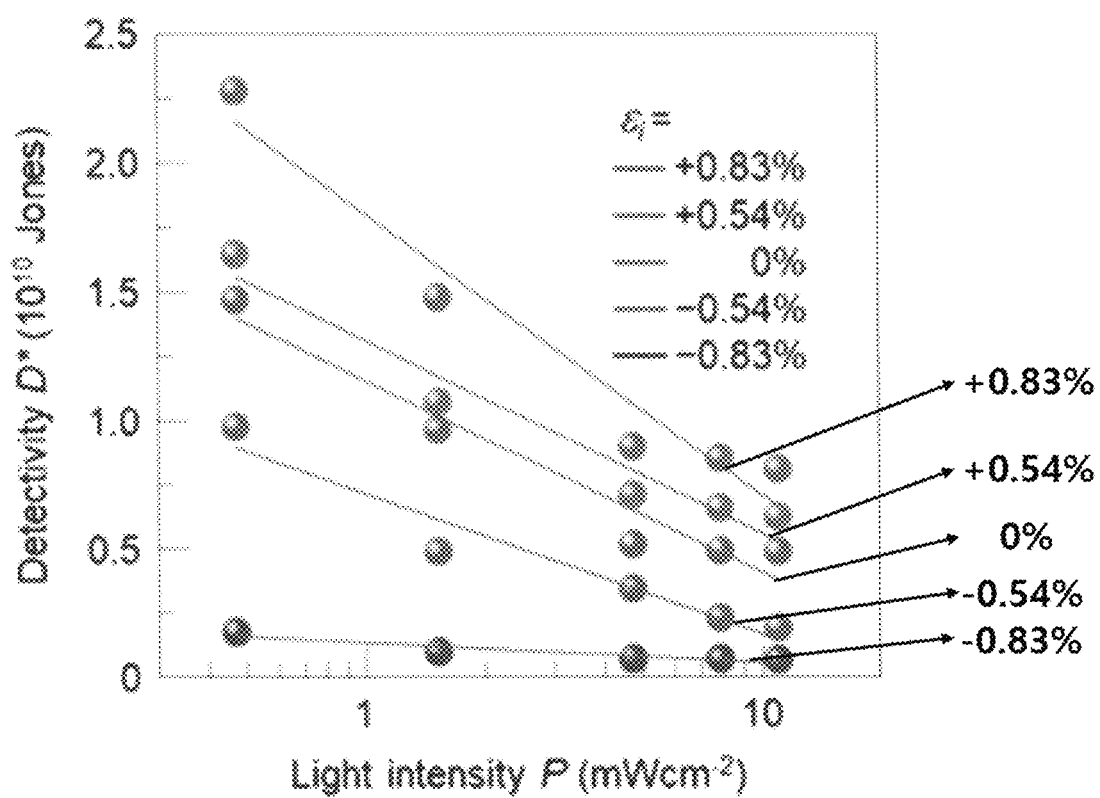
FIG. 10 is a graph showing detectivity (D*) with respect to light intensity.

The detectivity (D*) indicating the photoresponsivity under a dark current density was measured with the photodetector prepared in Preparation Example of the present disclosure and change in detectivity with respect to the light intensity P is shown in FIG. 10. It can be seen that the detectability (D*) also strongly depends on the level of in-situ strain. At a light intensity of 0.47 mW/cm$^2$ and a tensile strain of +0.83%, due to an exceptionally high photocurrent despite the relatively high dark current of approximately 7.99 μA, the detectivity (D*) was approximately 2.28×10$^{10}$ Jones.

Evaluation Example 6

Device Reliability

Figure 11A:
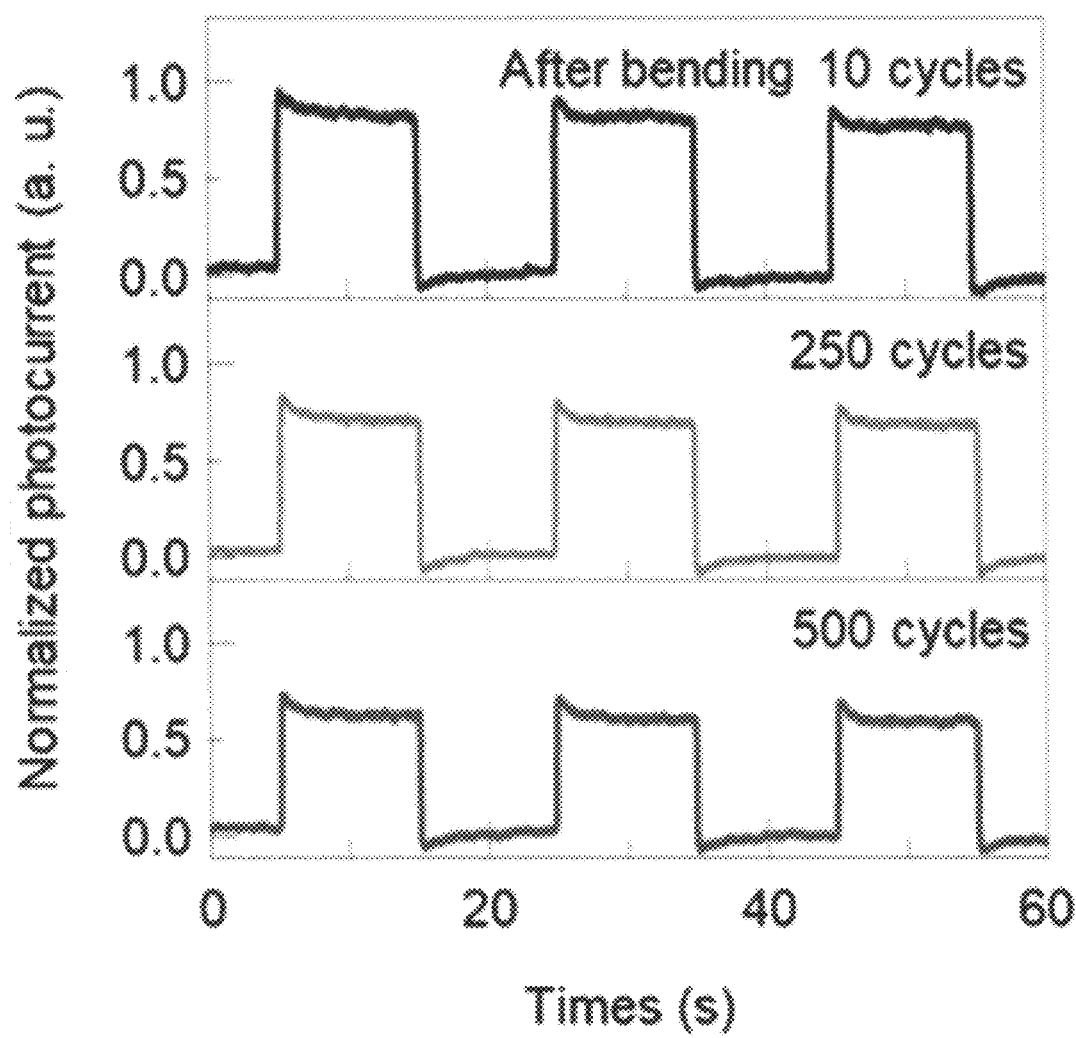
FIGS. 11A to 11C show the reliability of a photodetector for repeated bending cycles (FIG. 11A), the reliability of a photodetector for long-term storage (FIG. 11B), and the reliability of a photodetector with light irradiation time (FIG. 11C)

The photocurrent characteristics were measured while repeating bending at a bending strain of 1% for up to 500 cycles using a photodetector with a strain of +0.83%, and the results are shown in FIG. 11A (bending reliability). From FIG. 11A, it was found that the photocurrent was well maintained even after 500 bending cycles.

Figure 11B:
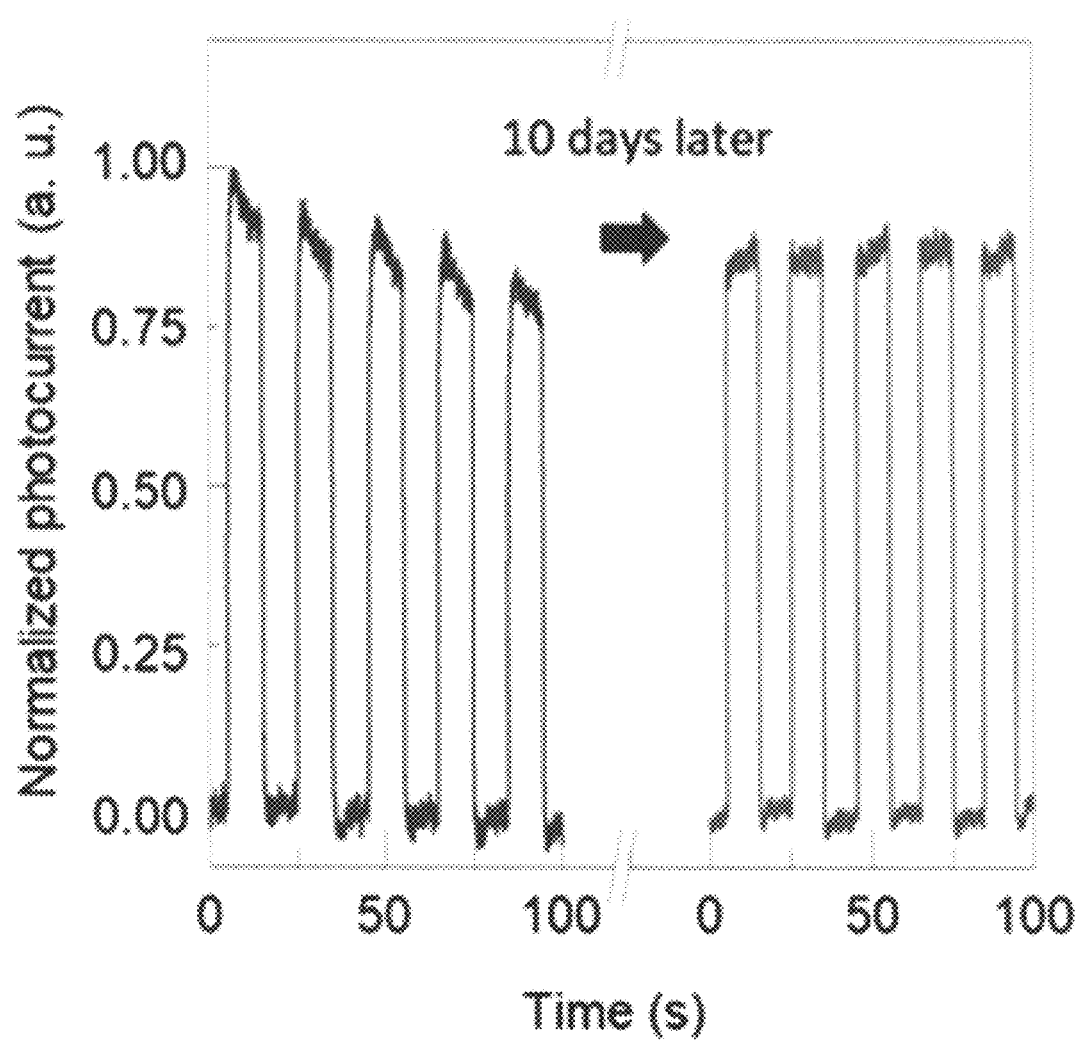

Similarly, after storing the +0.83% strained photodetector at 60±5% humidity and 25° C. for 10 days, the photocurrent was measured. The results are shown in FIG. 11B. It can be seen from FIG. 11B that the photodetector of the present disclosure exhibits stable performance.

Figure 11C:
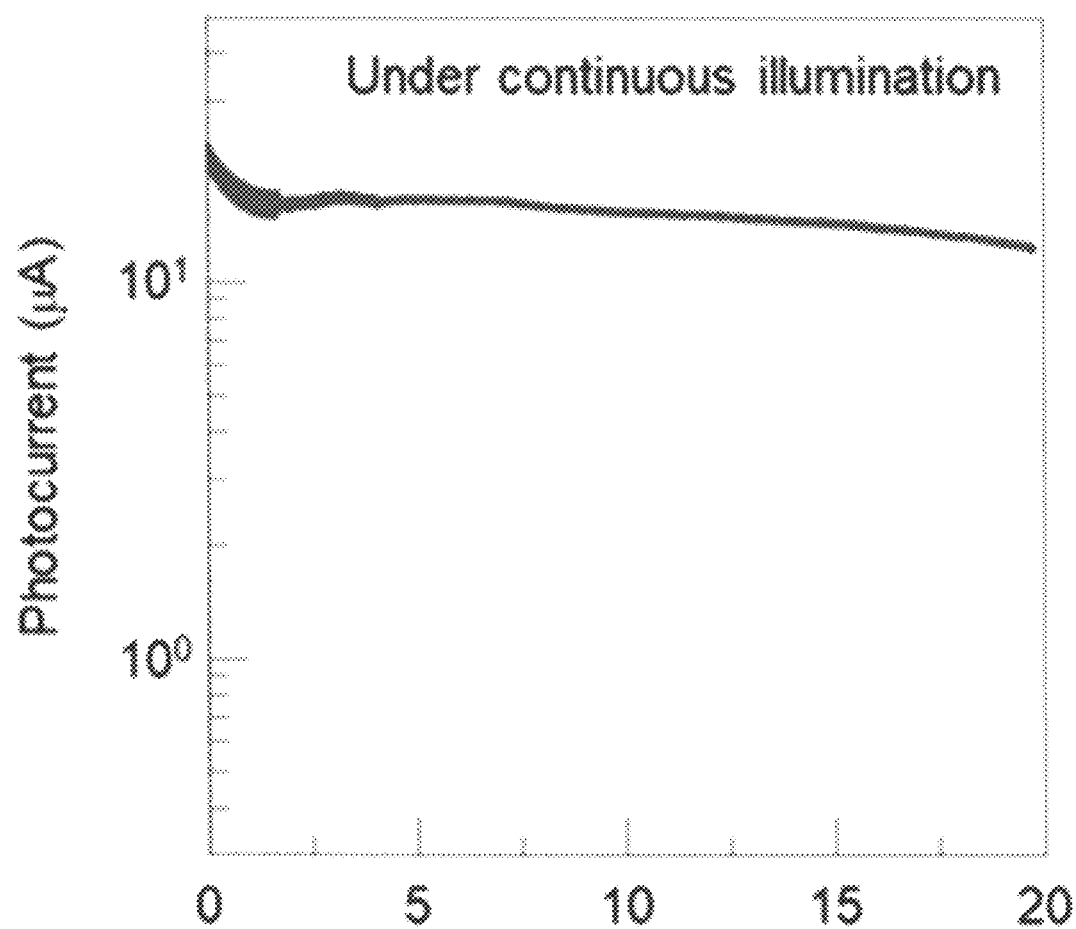

In addition, the photocurrent was measured while continuously irradiating the +0.83% strained photodetector with light for 20 hours. The results are shown in FIG. 11C. It can be seen from FIG. 11C that the photocurrent is preserved despite continuous light irradiation.

As described above, it can be seen that the photodetector of the present disclosure exhibits sufficient reliability for the repetition of the bending cycle or the passage of time.

—Piezoelectric Device—

Production Example 2

Preparation of Piezoelectric Device

An ITO-coated polyethylene naphthalate (PEN) substrate (20 mm×25 mm) was sonicated in an isopropyl alcohol bath for 10 minutes and then subjected to oxygen plasma treatment for 5 minutes to obtain a surface-treated substrate. $PbBr_2$ (99.99%, TCI, Japan) was dissolved in N,N-dimethylformamide (DMF<anhydrous, 99.8%, Sigma-Aldrich Inc., USA) at a concentration of 367 mg/ml and stirred at room temperature for 5 hours. CsBr (99.9%, TCI, Japan) was separately dissolved in anhydrous methanol (anhydrous, Daejung, Korea) at a concentration of 15 mg/ml. A $PbBr_2$ solution was spin-coated on an ITO/PEN substrate at 3,500 rpm for 30 seconds and then annealed at 75° C. for 15 minutes. Next, the annealed $PbBr_2$/ITO/PEN was uniaxially bent to be convex or concave with a predetermined radius of curvature. The resulting $PbBr_2$ film which was bent was immersed in a CsBr solution at 50° C. for 15 minutes to form a perovskite thin film. The perovskite thin film thus formed through two steps was rinsed with IPA and dried again at 50° C. in an oven for 10 minutes. The stress applied to the $CsPbBr_3$ film was removed so that the substrate returns to the original flat state. The PDMS layer was spin-coated onto another ITO/PEN substrate and cured. A piezoelectric energy harvesting device having a PEN/ITO/PDMS/$CsPbBr_3$/ITO/PEN structure was fabricated by stacking the two ITO/PEN substrates in a manner that the $CsPbBr_3$ film and the PDMS layer face each other.

Evaluation Example 7

Evaluation of Piezoelectric Characteristics

Figure 12A:
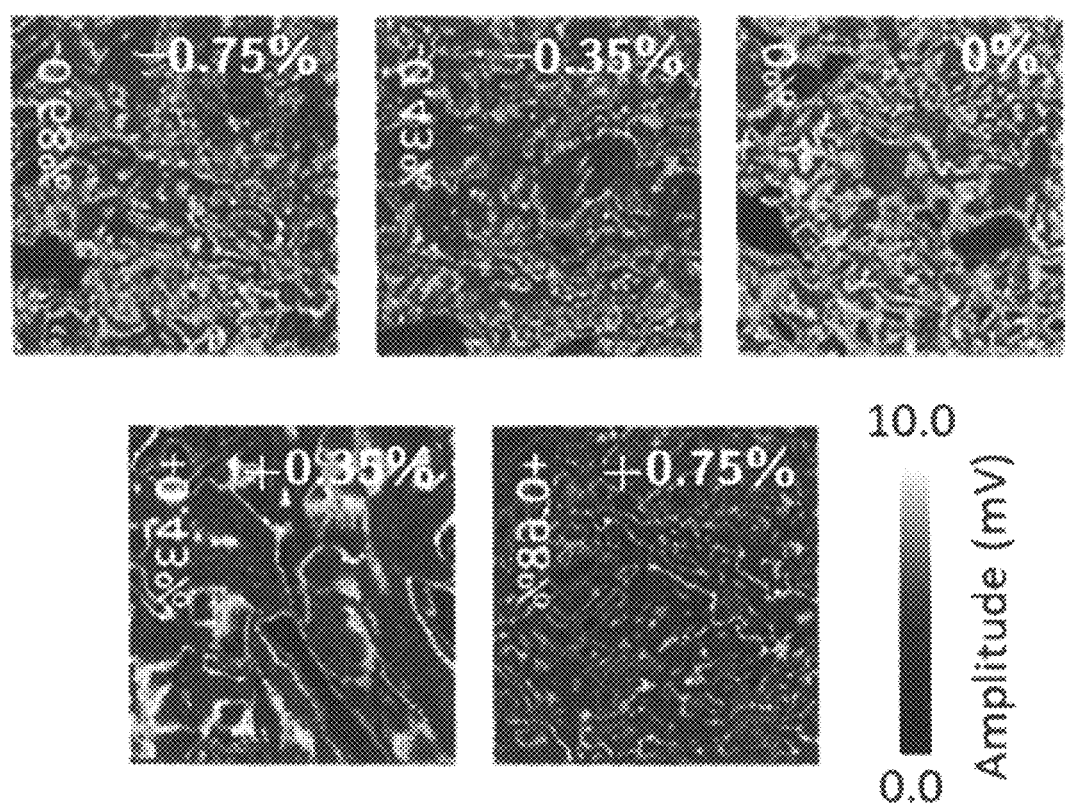
Figure 12B:
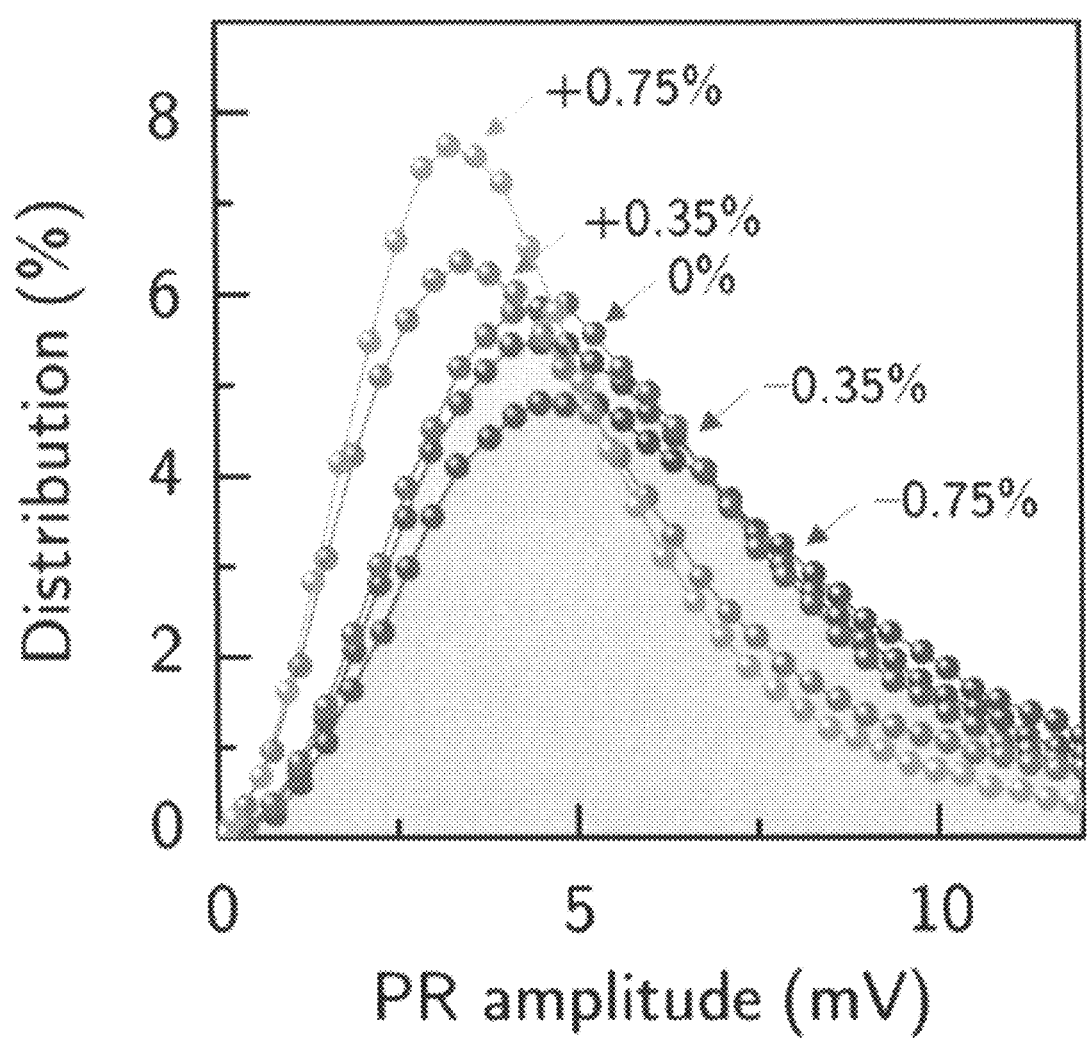
Figure 12C:
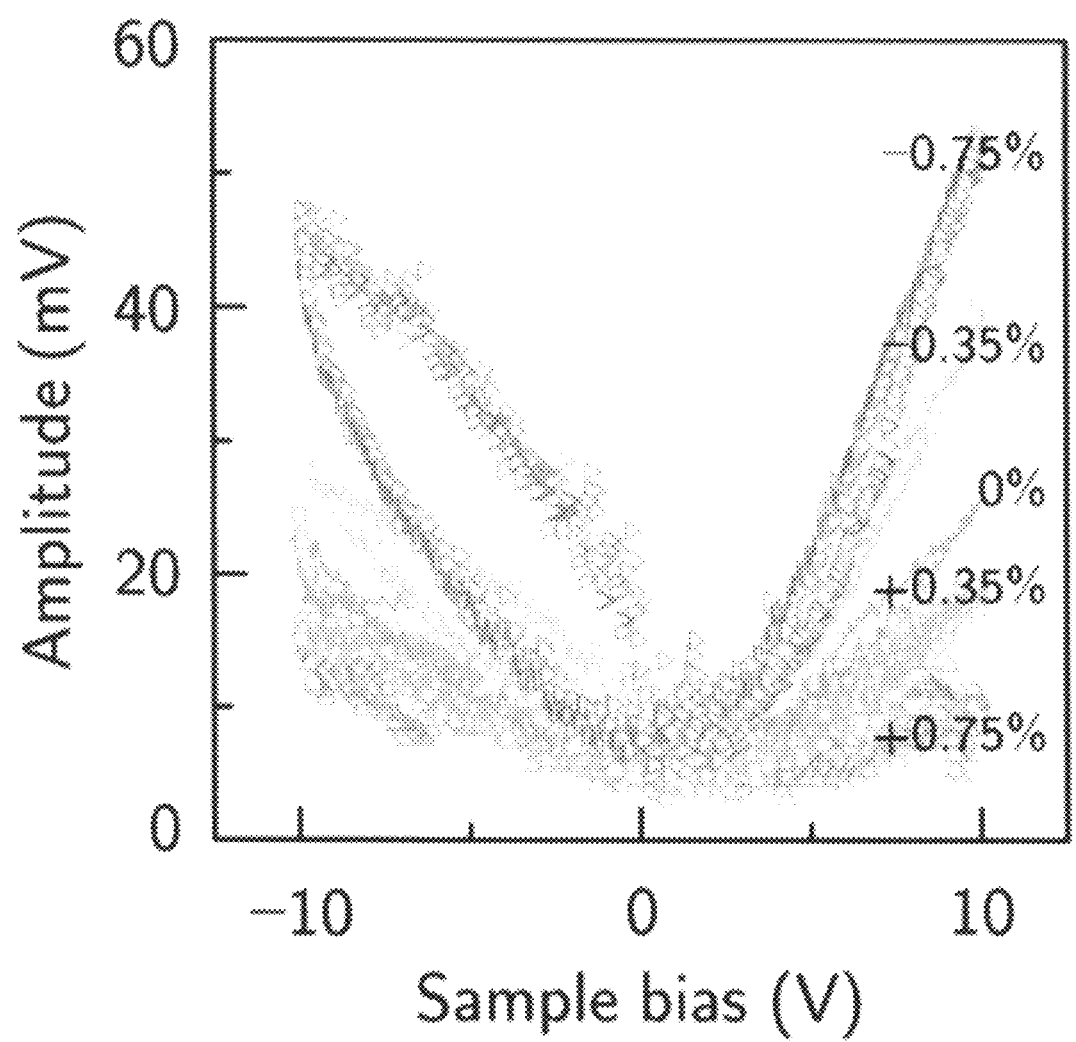
Figure 12D:
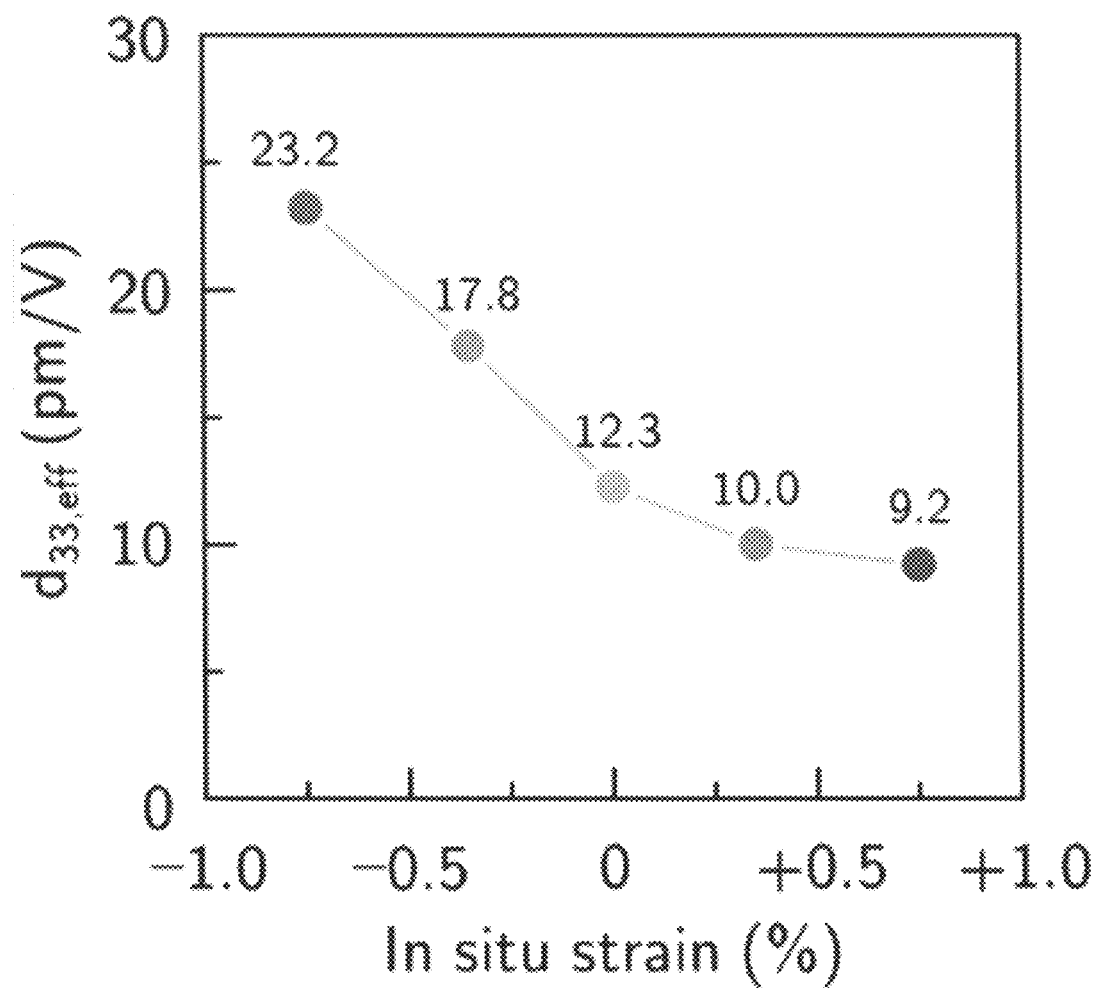

FIGS. 12A to 12D show the piezoelectric characteristics of a $CsPbBr_3$ thin film with an in-situ strain. FIG. 12A is a piezoresponse force microscope (PFM) image, FIG. 12B shows the distribution of PR amplitudes, FIG. 12C shows an amplitude according to a bias voltage, and FIG. 12d shows effective piezoelectric coefficients $d_{33,eff}$ according to an in-situ strain. Referring to FIGS. 12B and 12C, as the in-situ strain decreased, the distribution of PR amplitudes greatly moved to a larger size, and the amplitude change according to the bias voltage was also large. In addition, it can be seen from FIG. 12D that the effective piezoelectric coefficient increases as the in-situ strain decreases.

Figure 13A:
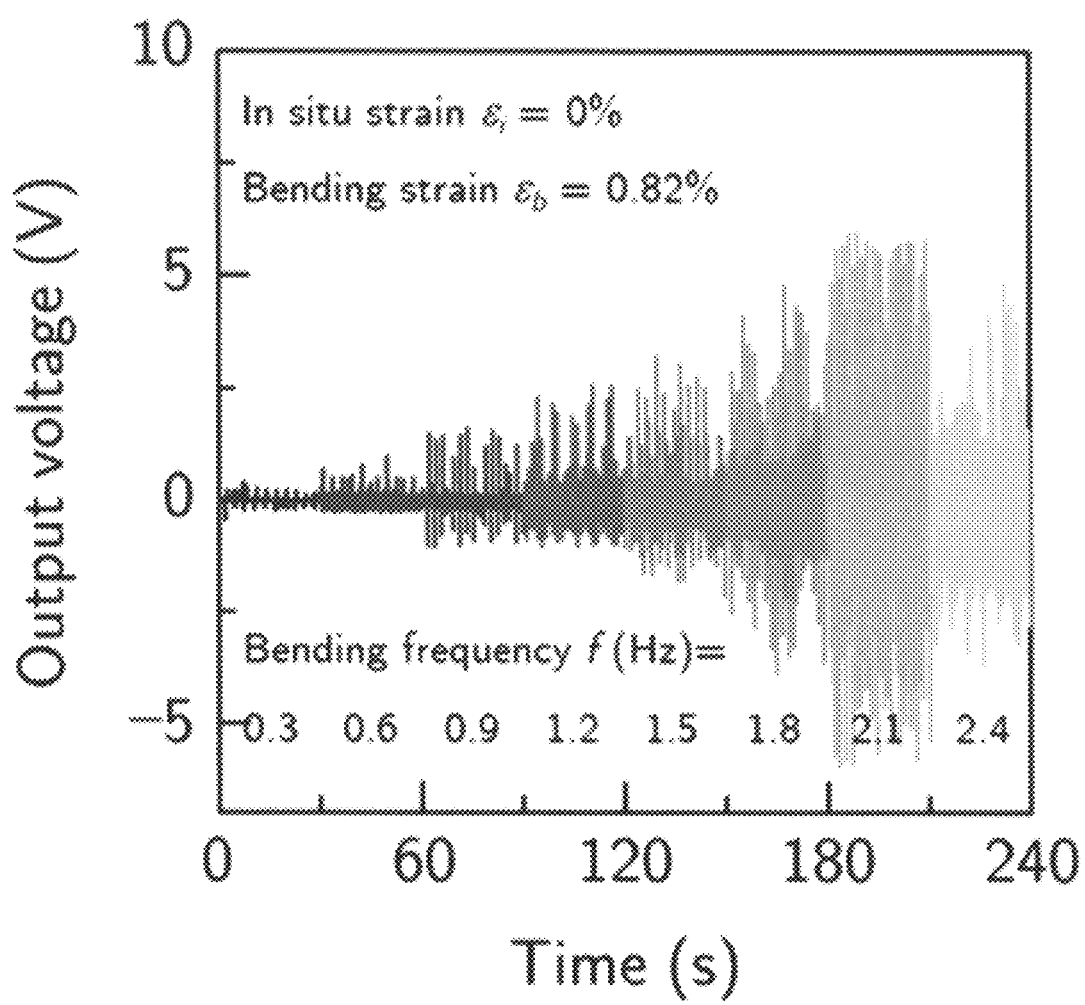
FIGS. 13A and 13B show the frequency-dependent piezoelectric output characteristics of a CsPbBr$_3$ piezoelectric energy harvester with a strain of 0%.
Figure 13B:
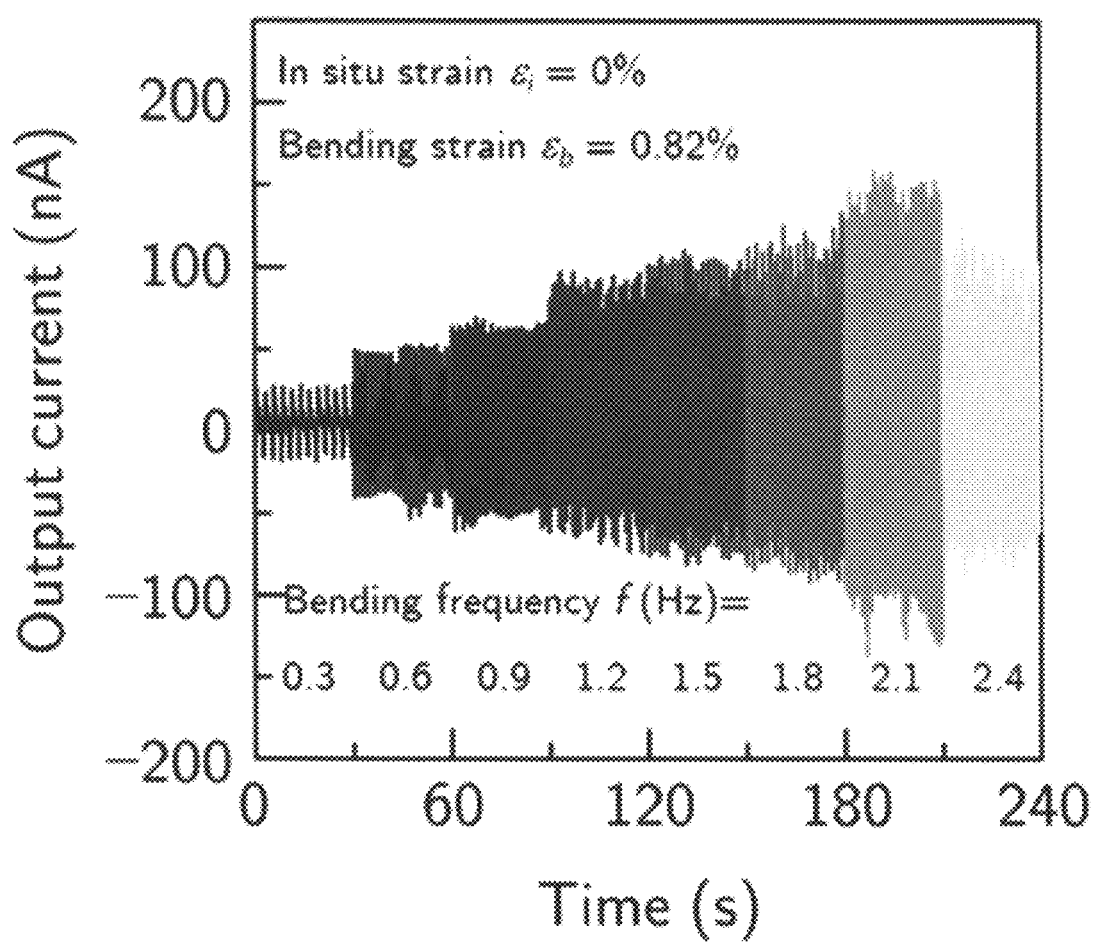

FIG. 13A and FIG. 13B show the frequency-dependent piezoelectric output characteristics of a $CsPbBr_3$ piezoelectric energy harvester with a strain of 0%. As the bending frequency increased up to 2.1 Hz, the output voltage and output current values increased.

Figure 14A:
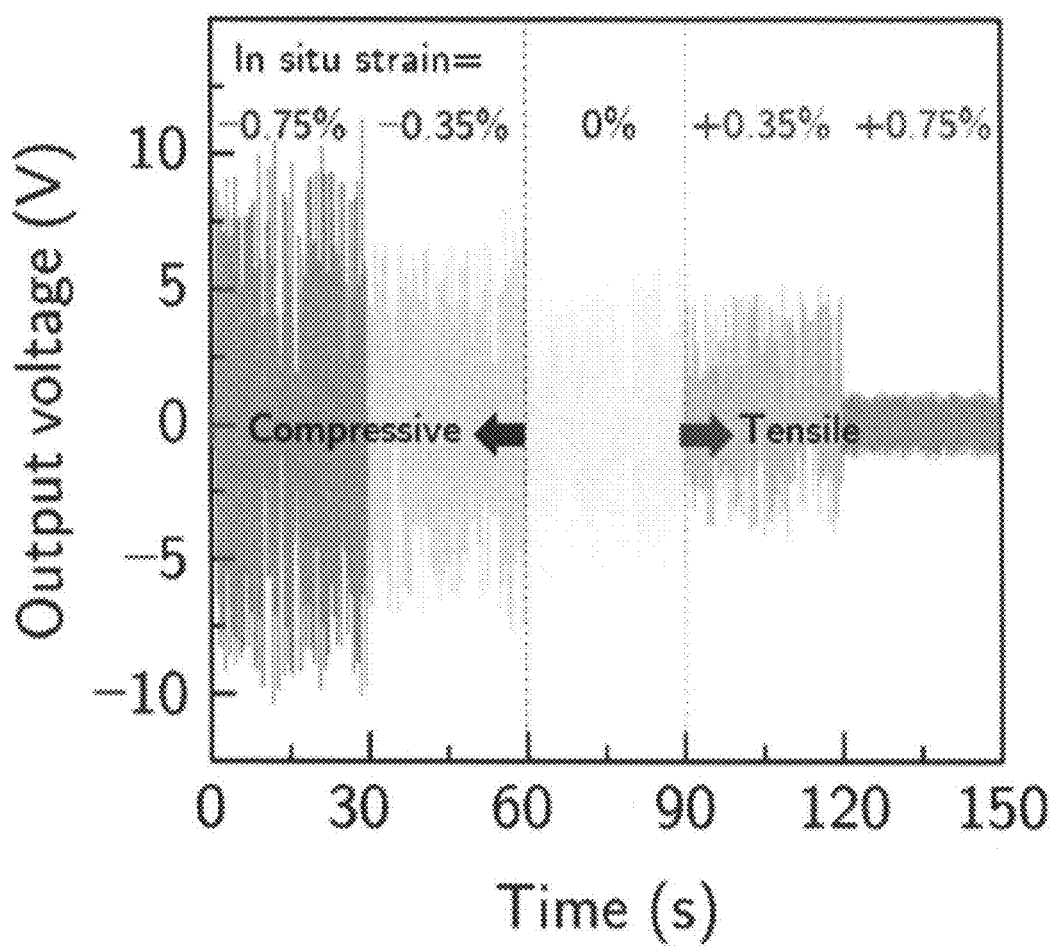
FIGS. 14A and 14B show the piezoelectric output characteristics of an energy harvester according to an in-situ strain.
Figure 14B:
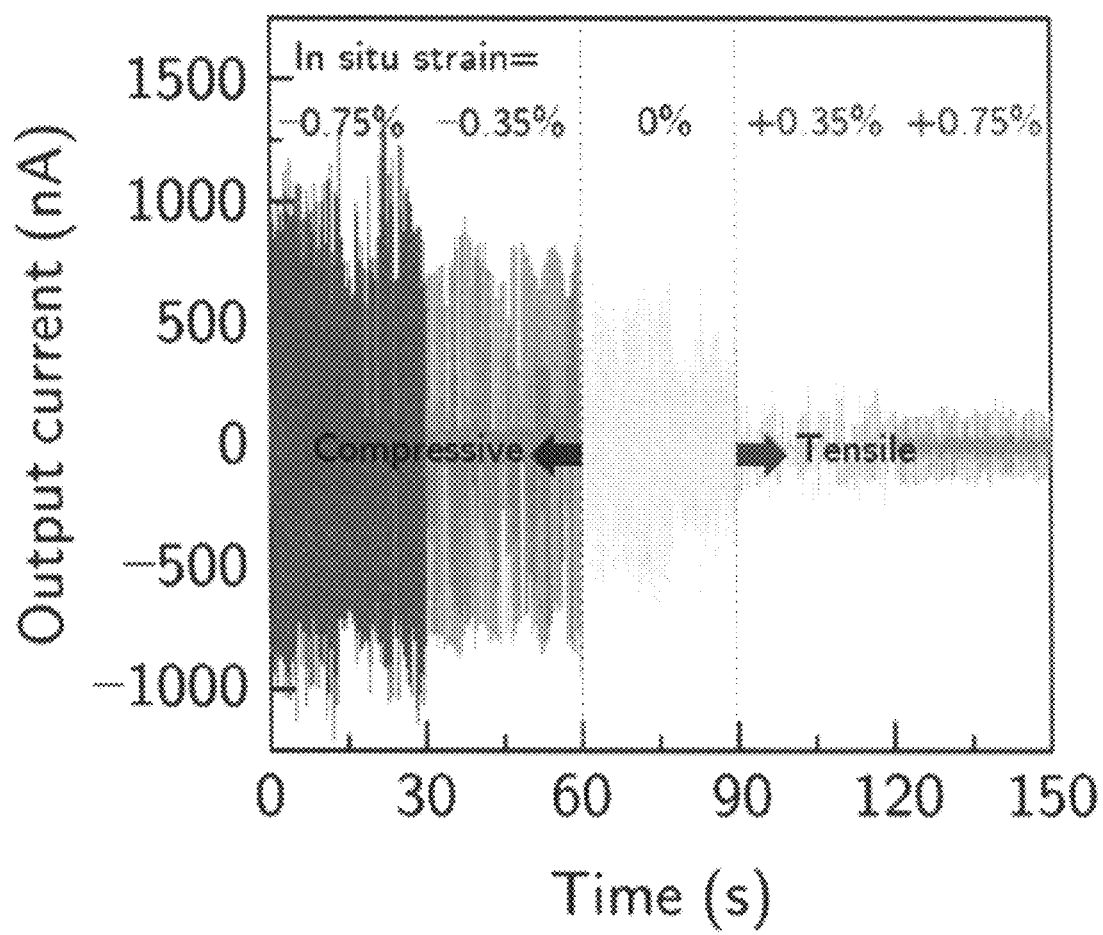

FIG. 14A and FIG. 14B show the piezoelectric output characteristics of an energy harvester according to an in-situ strain. It can be seen that the output voltage value and the output current value were larger in the state where the compressive strain was applied, and the piezoelectric output characteristics were better in the case of −0.75% compressive strain than the case of −0.35% compressive strain.

Figure 15:
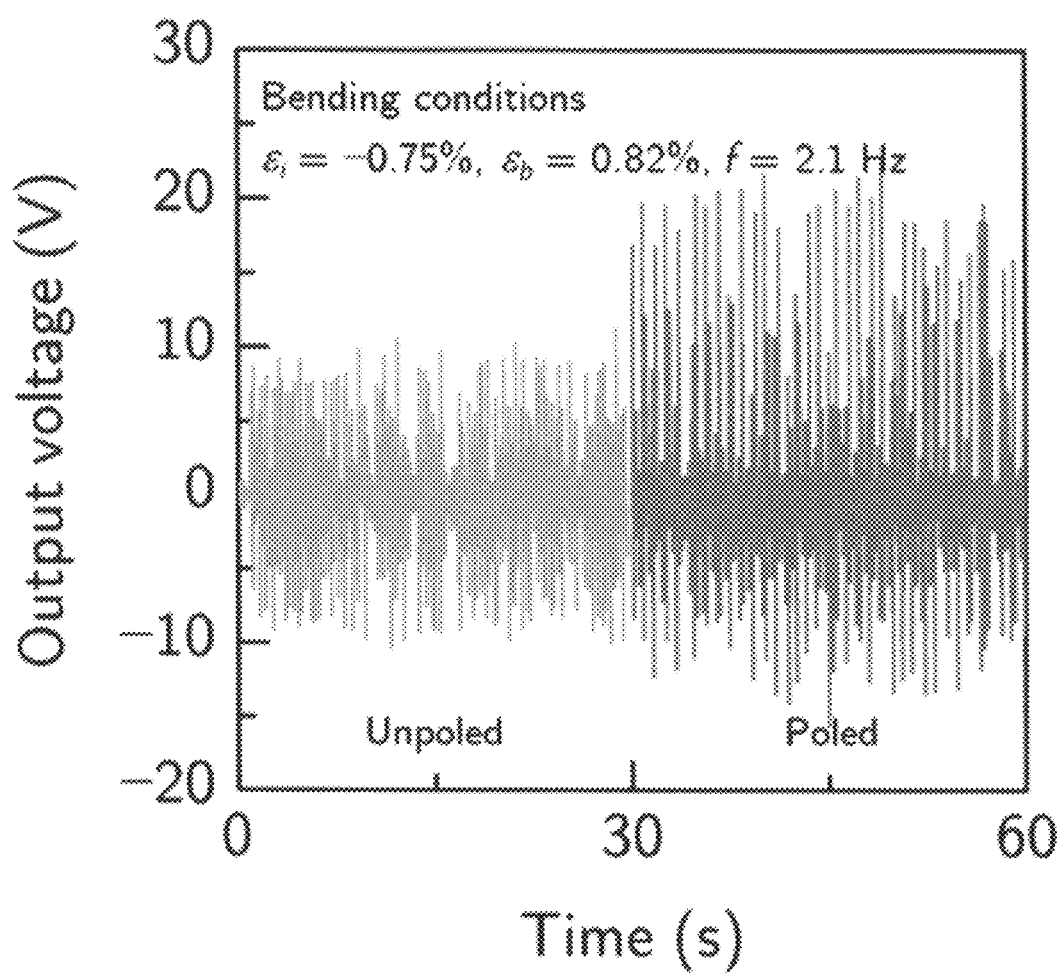
FIG. 15 is a comparison of output voltage characteristics after electrical poling of a CsPbBr$_3$ piezoelectric energy harvester with a strain of −0.75%.

FIG. 15 is a comparison of output voltage characteristics after electrical poling of a $CsPbBr_3$ piezoelectric energy harvester with a strain of −0.75%. It can be seen that the output voltage value increased after the electrical poling.

—Device Fabrication for Evaluation of Mechanical Properties—

Preparation Example 3

A PES substrate (15 mm×25 mm) was washed in an ultrasonic bath for 10 minutes, and then irradiated with UV in a UV-ozone furnace for 20 minutes. The UV-treated PES substrate was spin-coated with an aqueous solution of PEDOT:PSS (Clevios PH 1000, manufactured by Heraeus, Germany) at 3500 rpm for 30 seconds and dried at 70° C. for 15 minutes.

For a $CsPbBr_3$ thin film, Pb(II) bromide ($PbBr_2$, 99.99%, manufactured by TCI, Japan) was mixed with N,N-dimethylformamide (DMF, anhydrous, 99.8%, manufactured by Sigma-Aldrich, USA) at a concentration of 367 mg/mL. Then, the solution was stirred at room temperature for 5 hours. Cesium bromide (CsBr, 99.9%, manufactured by TCI, Japan) was separately dissolved in anhydrous methanol ($CH_3OH$, manufactured by Daejung, Korea) at a concentration of 15 mg/mL. The $PbBr_2$ solution was spin-coated on the PEDOT:PSS-coated PES substrate at 3500 rpm for 30 seconds and annealed at 70° C. for 15 minutes. Then, the annealed $PbBr_2$/PEDOT:PSS/PES specimen was uniaxially bent to be convex or concave with a predetermined curvature so that a corresponding compressive (or tensile) strain was generated in the thin film. $CsPbBr_3$ was synthesized by dip coating the bent $PbBr_2$ film sample in a CsBr solution at 50° C. for 15 minutes. The two-step deposited film was rinsed with isopropanol and annealed at 50° C. for 5 minutes.

For a hybrid $MAPbI_3$ thin film, 693 mg of Pb(II) iodide ($PbI_2$, 99.9%, manufactured by TCI, Japan) was dissolved in 1 mL of DMF at 100° C. to prepare a $PbI_2$ precursor solution. The $PbI_2$ solution was spin-coated on a PEDOT:PSS/PES substrate at 4000 rpm for 30 seconds and annealed at 75° C. for 5 minutes. Methylammonium iodide ($CH_3NH_3I$, 99.9%, manufactured by TCI, Japan) was dissolved in isopropyl alcohol (($CH_3)_2CHOH$) at a concentration of 20 mg/mL to prepare an MAI solution. The concavely or convexly bent $PbI_2$ film sample was immersed in the MAI solution at 50° C. for 15 minutes, rinsed with isopropyl alcohol, and then annealed at 50° C. for 5 minutes to obtain a $MAPbI_3$ film.

The annealed $CsPbBr_3$ and $MAPbI_3$ film samples were returned from the bent state to the original flat state. The in-situ bending curvature for the deposition was controlled so that the in-situ strains in the final perovskite films became −1.33%, −0.87%, −0.45%, 0%, +0.45%, +0.87%, and +1.33%.

Evaluation Example 8

Figure 16A:
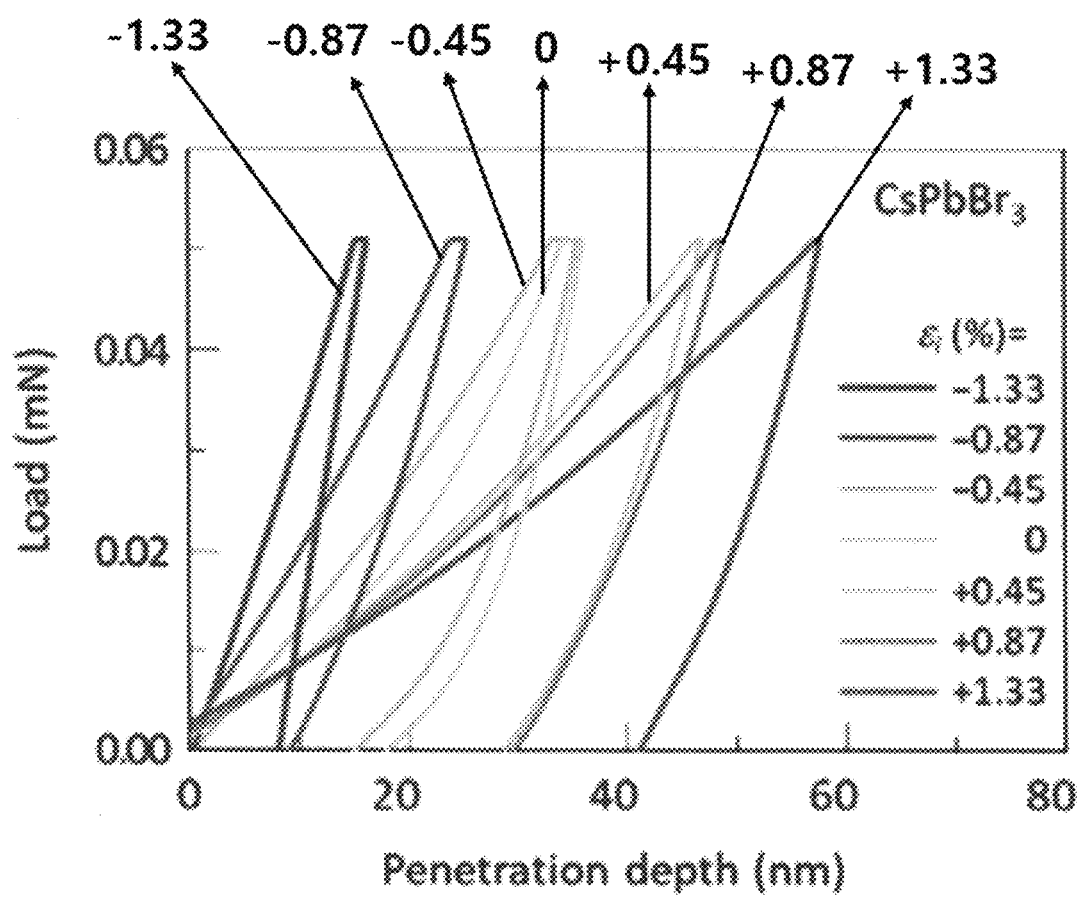
FIGS. 16A to 16D show Young's modulus and hardness of samples with an in-situ strain.
Figure 16B:
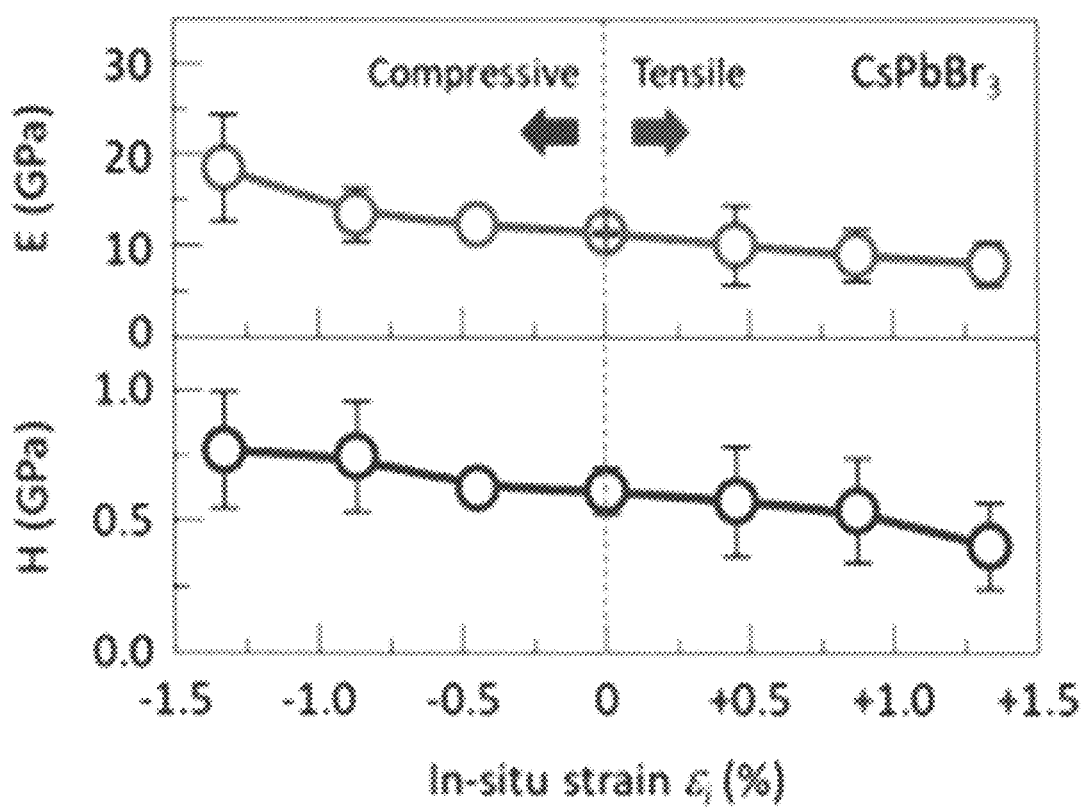
Figure 16C:
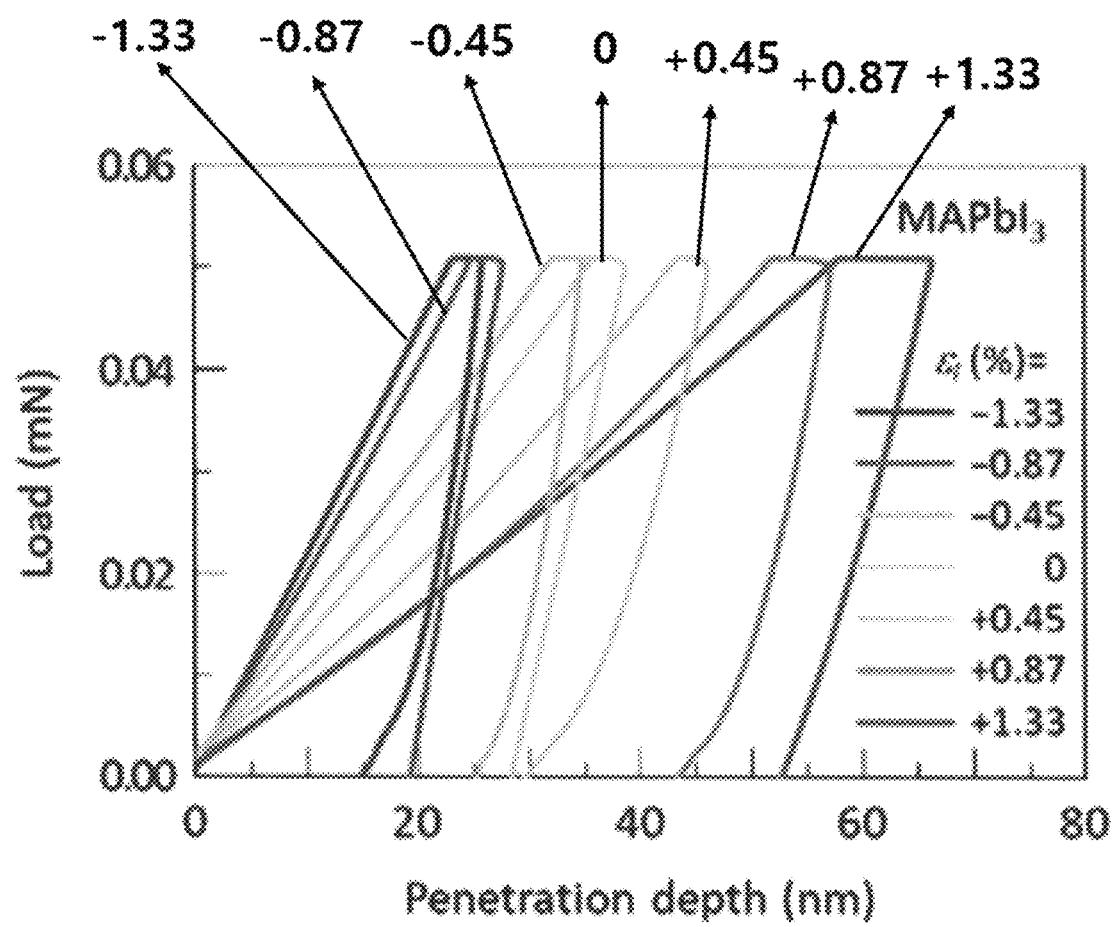
Figure 16D:
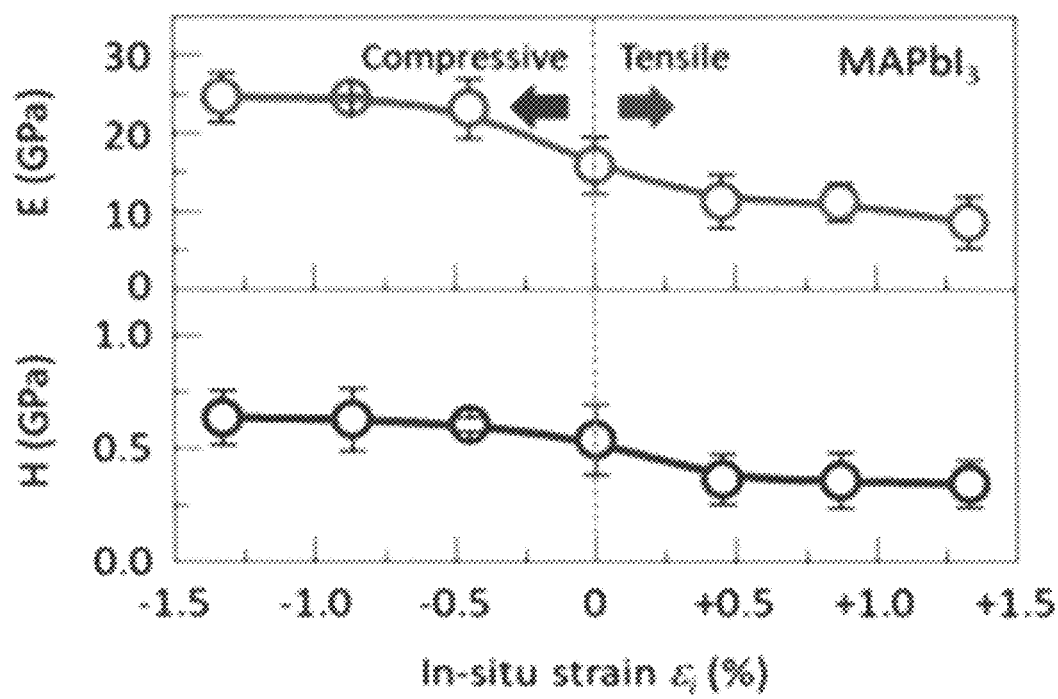

Evaluation of Effect of Compressive or Tensile Strain on Bending Fracture Behavior of Halide Perovskite Thin Film Nanoindentation measurement was performed in a manner to control loading to evaluate Young's modulus and hardness of the in-situ strained samples. FIG. 16A shows the penetration depth curve of the in-situ strained $CsPbBr_3$ film sample. The applied loading was limited to 0.051 mN to remove unnecessary influence of the ductile polymer substrate. The elastic modulus E and hardness H were measured by the Oliver and Pharr method. The measured effective value is expressed as a function of the in-situ strain $\varepsilon_i$ in FIG. 16B. The E value of the unstained (0% $\varepsilon_i$) sample was approximately 11.5 GPa. The E and H values depended on the level of the in-situ strain. It seems that the higher the compression in-site strain $\varepsilon_i$, the stronger the mechanical resistance to external force. For example, as the compressive strain increased up to a maximum strain of −1.33%, both values increased together. The maximum E value of the $CsPbBr_3$ film was approximately 18.6 GPa for the sample with a strain of −1.33%, indicating an approximately 62% increase compared to the reference sample with no strain. The maximum compression in-situ strain $\varepsilon_i$ was approximately 24% when the corresponding H increased from 0.62 GPa to 0.77 GPa. FIG. 16C shows the penetration depth curve of the $MAPbI_3$ thin film. The $MAPbI_3$ thin film showed the same trend in E and H value changes according to the in-situ strain $\varepsilon_i$ as the $CsPbBr_3$ thin film. For example, the maximum E and H values of the −1.33% $\varepsilon_i$ sample were 24.6 GPa and 0.64 GPa, respectively. It can be seen that when compared with 15.9 GPa and 0.54 GPa which are the E and H values of the unstrained $MAPbI_3$ sample, respectively, the $CsPbBr_3$ sample and the $MAPbI_3$ sample show similar levels of change in E and H values at the same $\varepsilon_i$. When the maximum compression in-situ strain $\varepsilon_i$ was −1.33%, the $CsPbBr_3$ sample showed an increase of about 62% in the E value and the $MAPbI_3$ sample showed an increase of about 55% in the E value. In the case of the H value, the $CsPbBr_3$ sample showed an increase of about 24% and the $MAPbI_3$ sample showed an increase of about 19%.

Figure 17A:
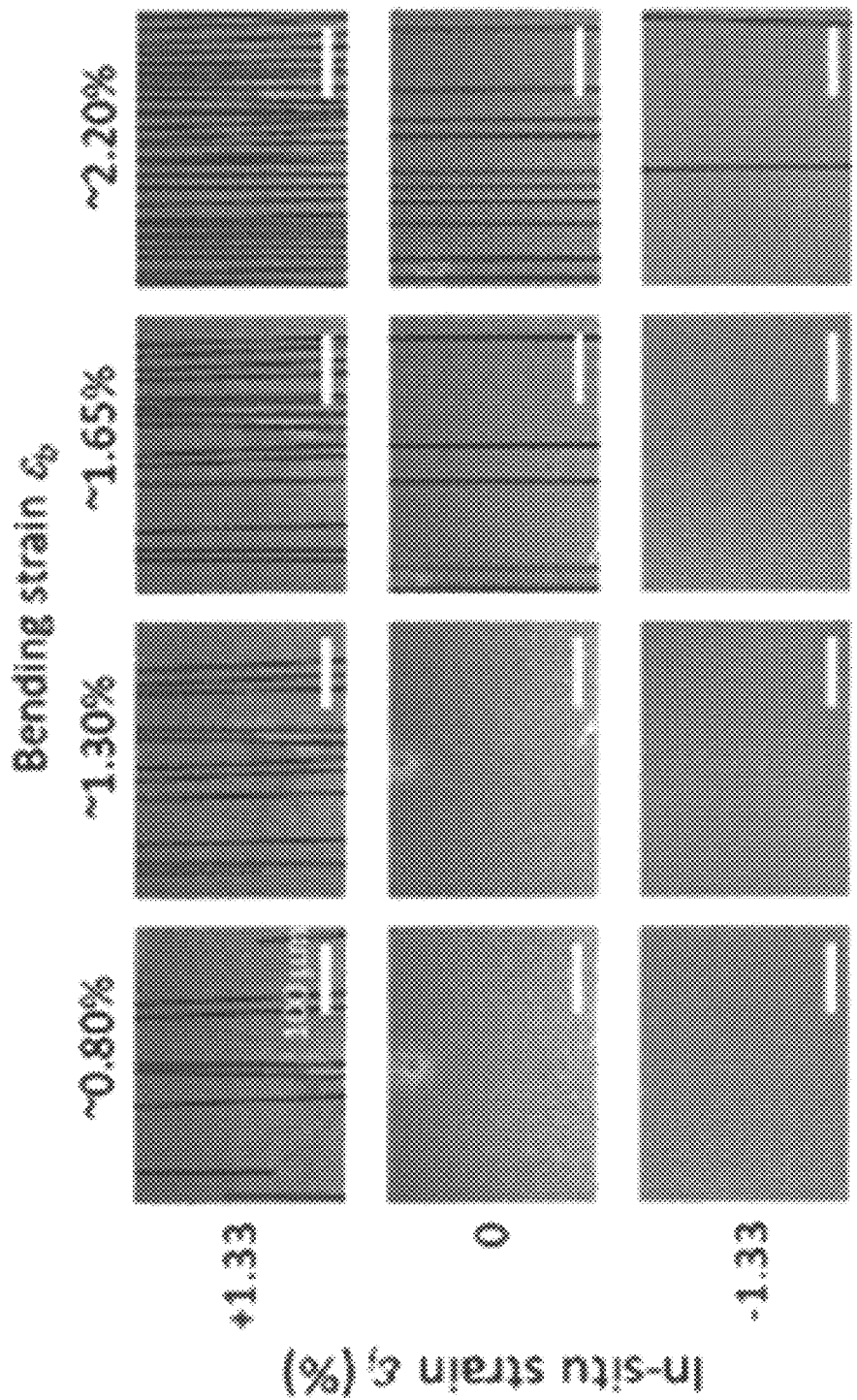
FIGS. 17A and 17D are optical microscopy images showing cracking due to bending strain.

FIG. 17A shows optical images of the film surfaces with bending strains εb of approximately 0.80%, 1.30%, 1.65%, and 2.20%, respectively in three cases where the $\varepsilon_i$ is −1.33%, 0%, and +1.33% for $CsPbBr_3$ thin films. The number of linear cracks on the film surface varied depending on the $\varepsilon_i$ value. Comparing the crack behaviors with reference to FIG. 17A, the −1.33% strain sample has a smaller number of linear cracks than the other samples. Accordingly, it is seen that the effect is excellent when the compressive in-situ strain $\varepsilon_i$ is present in the film.

Figure 17B:
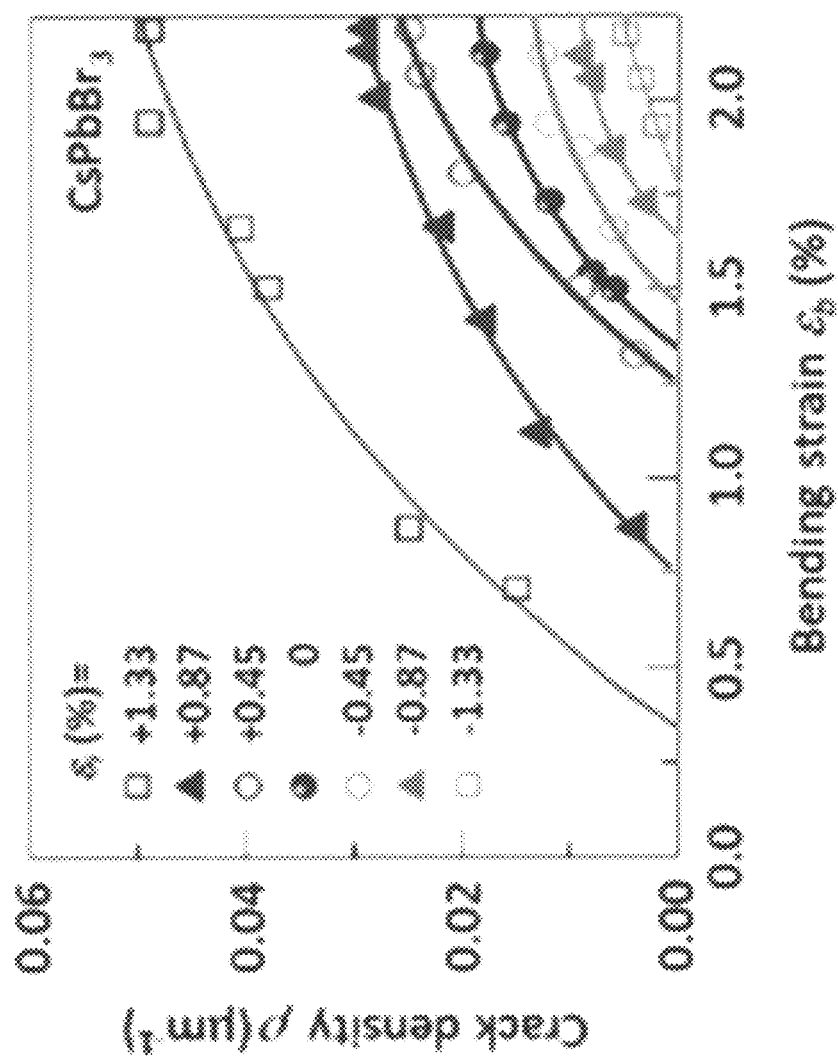
FIGS. 17B and 17E are graphs showing crack density according to bending strain.

Based on the number of cracks occurring on the film surface, an in-situ strain was applied to the $CsPbBr_3$ film with a strain range $\varepsilon_i$ of −1.33% to +1.33%, and the crack density ρ (number of cracks per unit length) was plotted as a function of a bending strain $\varepsilon_b$ in FIG. 17B. In the $CsPbBr_3$ film, the crack density increased parabolically as the $\varepsilon_b$ increased, regardless of the value of $\varepsilon_i$.

Figure 17C:
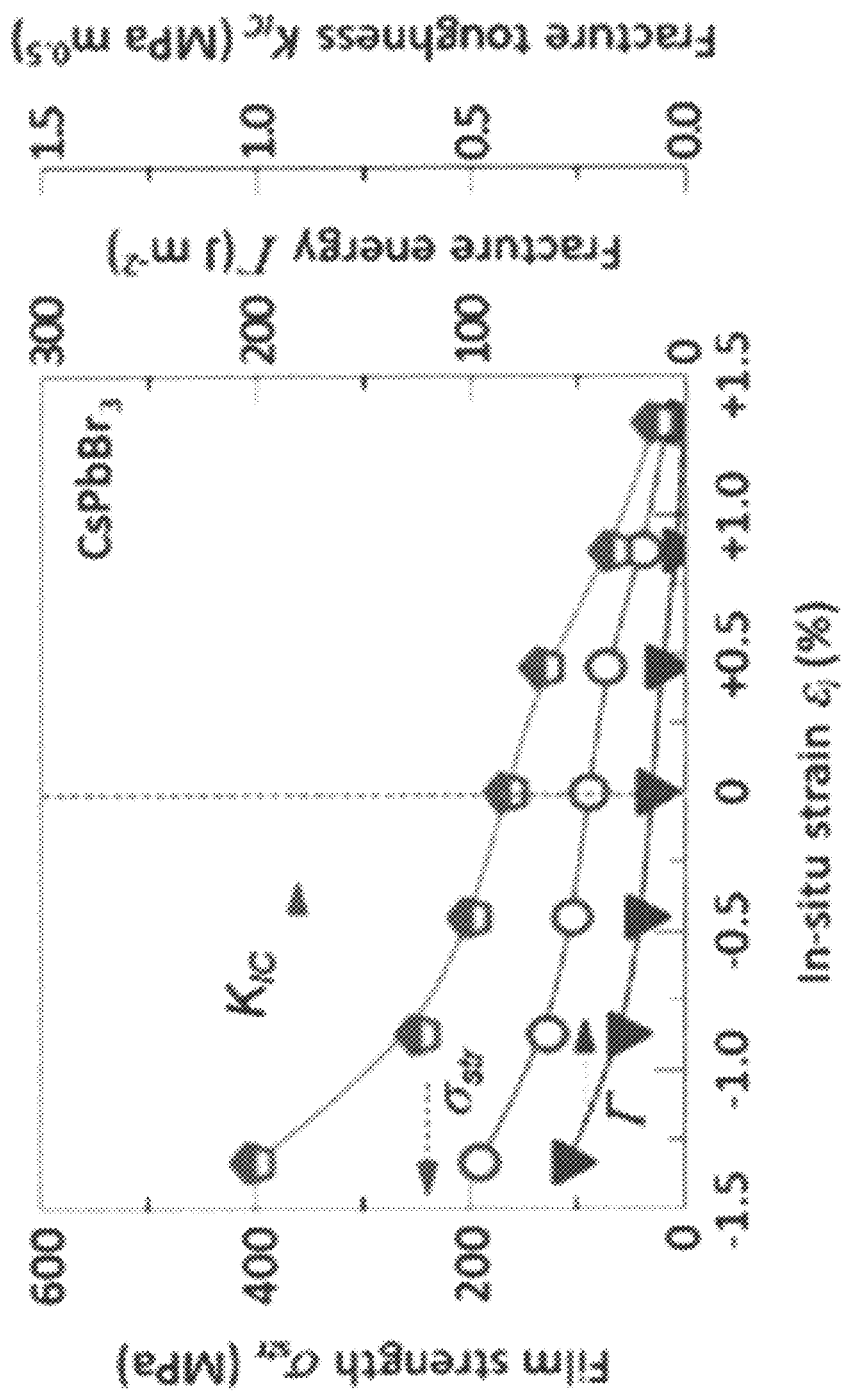
FIGS. 17C and 17F are a fracture energy graph and a strength graph according to an in-situ strain.

In the case of the films treated with compressive in-situ strain, a low crack density distribution was easily seen. Changes in other parameters, such as a critical strain $\varepsilon_c$ and a saturation crack density $\rho_s$ are shown in FIG. 17G. The term "critical strain" refers to a crack-initiation strain, which is obtained by plotting a crack density curve on the x-axis. This clearly shows that the compressive stress in a halide thin film has the advantage of improving the bending fracture resistance. That is, as the magnitude of the compressive strain $\varepsilon_i$ increases, the critical strain $\varepsilon_c$ increases and the saturation crack density $\rho_s$ decreases.

For the critical strain $\varepsilon_c$, the analysis of bending fracture behavior was extended by estimating additional mechanical parameters such as film strength $\sigma_{str}$, fracture energy $\Gamma$, and fracture toughness $K_{IC}$. The results are shown in FIG. 17C and are expressed as values for the in-situ strain $\varepsilon_i$. All the $\sigma_{str}$, $\Gamma$, and $K_{IC}$ values were highly dependent on in-situ strain, and the strained films exhibited improved values compared to unstrained films. For example, the $CsPbBr_3$ film exhibited a film strength $\sigma_{str}$ of about 191 MPa which was approximately 2.1 times higher than the film strength (about 89 MPa) of the untrained film. The fracture energy $\Gamma$ increased significantly from 15.0 J/m² of the unstrained $CsPbBr_3$ film to 54.1 J/m² when the compressive strain $\varepsilon_i$ was −1.33%, whereas the fracture energy $\Gamma$ decreased when there was a tensile strain. In the case of the $CsPbBr_3$ film, the calculated $K_{IC}$ value was in a range of 1.00 to 0.07 MPa m$^{0.5}$ depending on the $\varepsilon_i$ value.

Figure 17D:
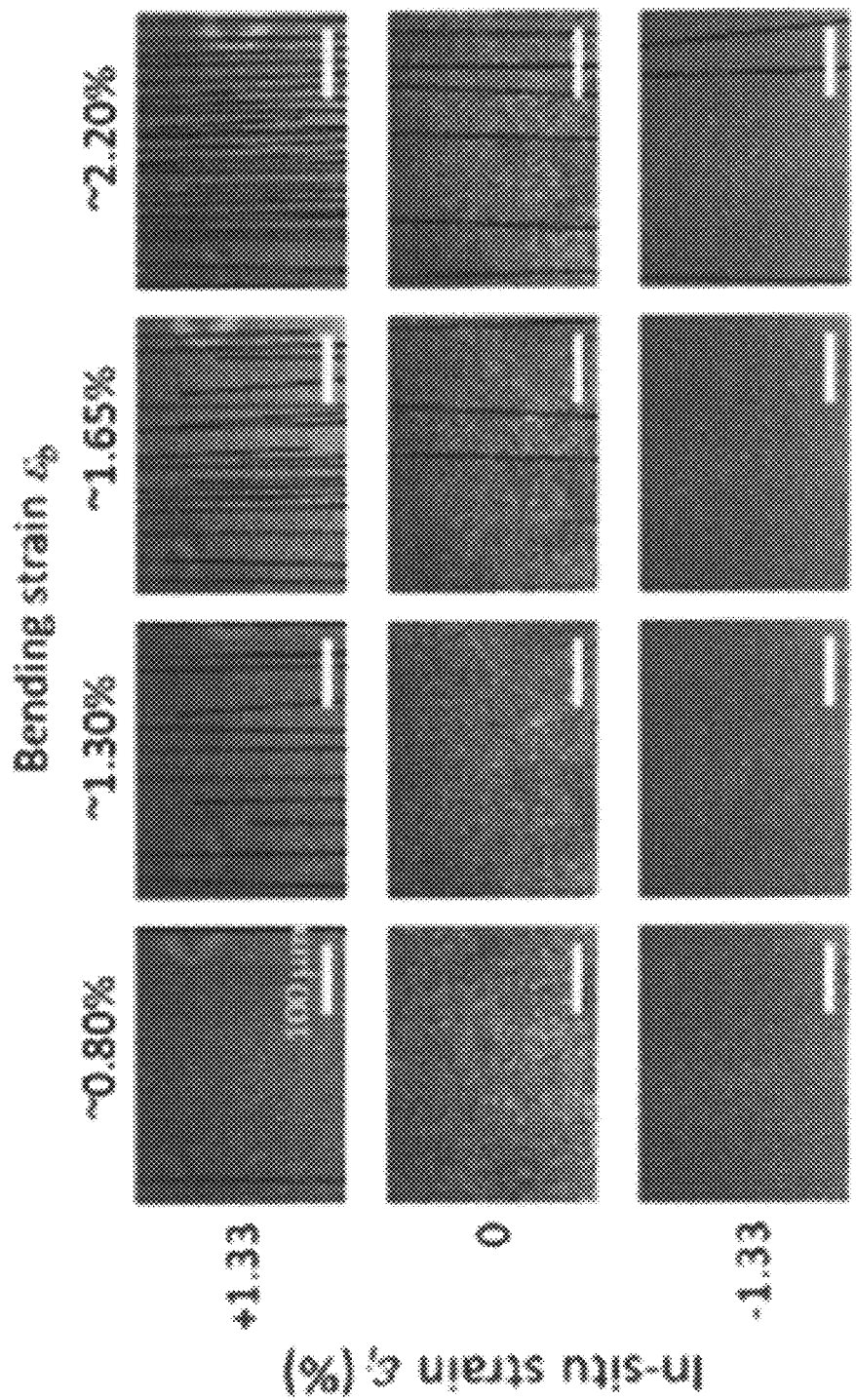

FIG. 17D shows fracture images of the $MAPbI_3$ thin films according to changes in bending strain $\varepsilon_b$. It can be seen that the number of cracks is small in the case of the presence of the compressive strain $\varepsilon_i$.

Figure 17E:
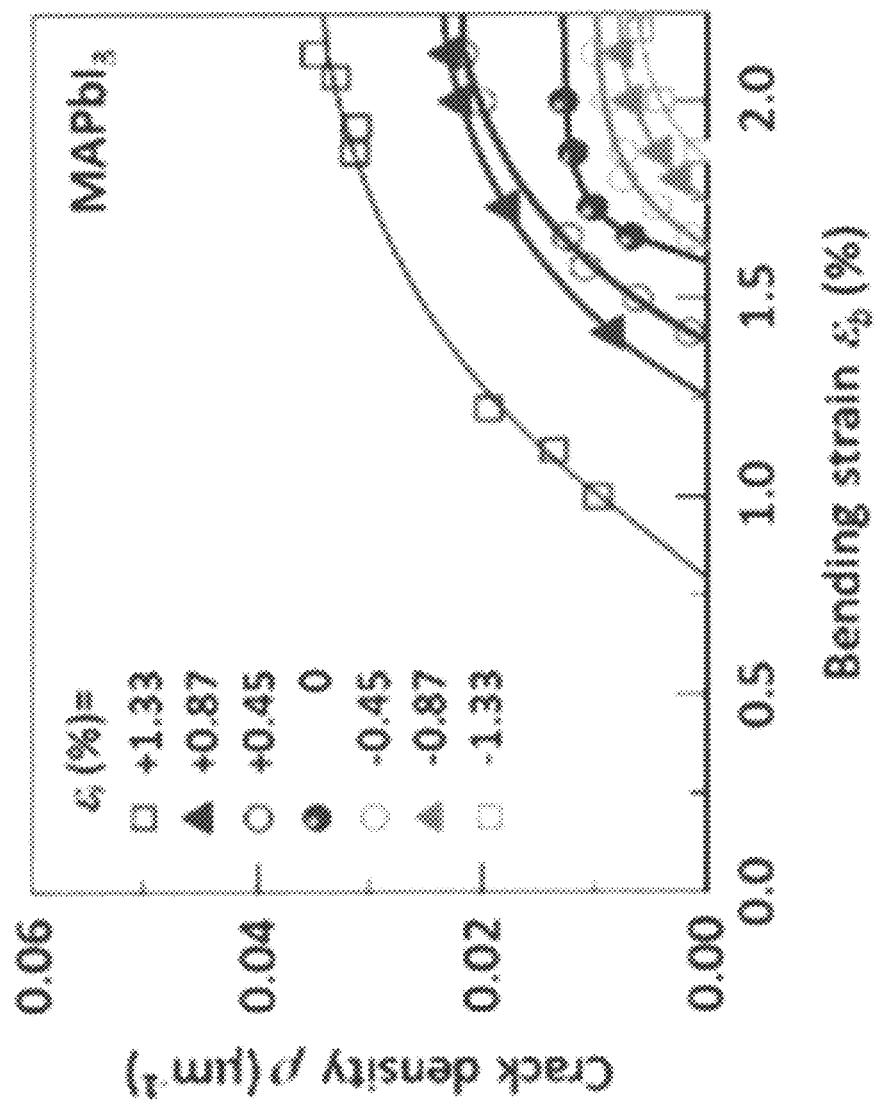
Figure 17F:
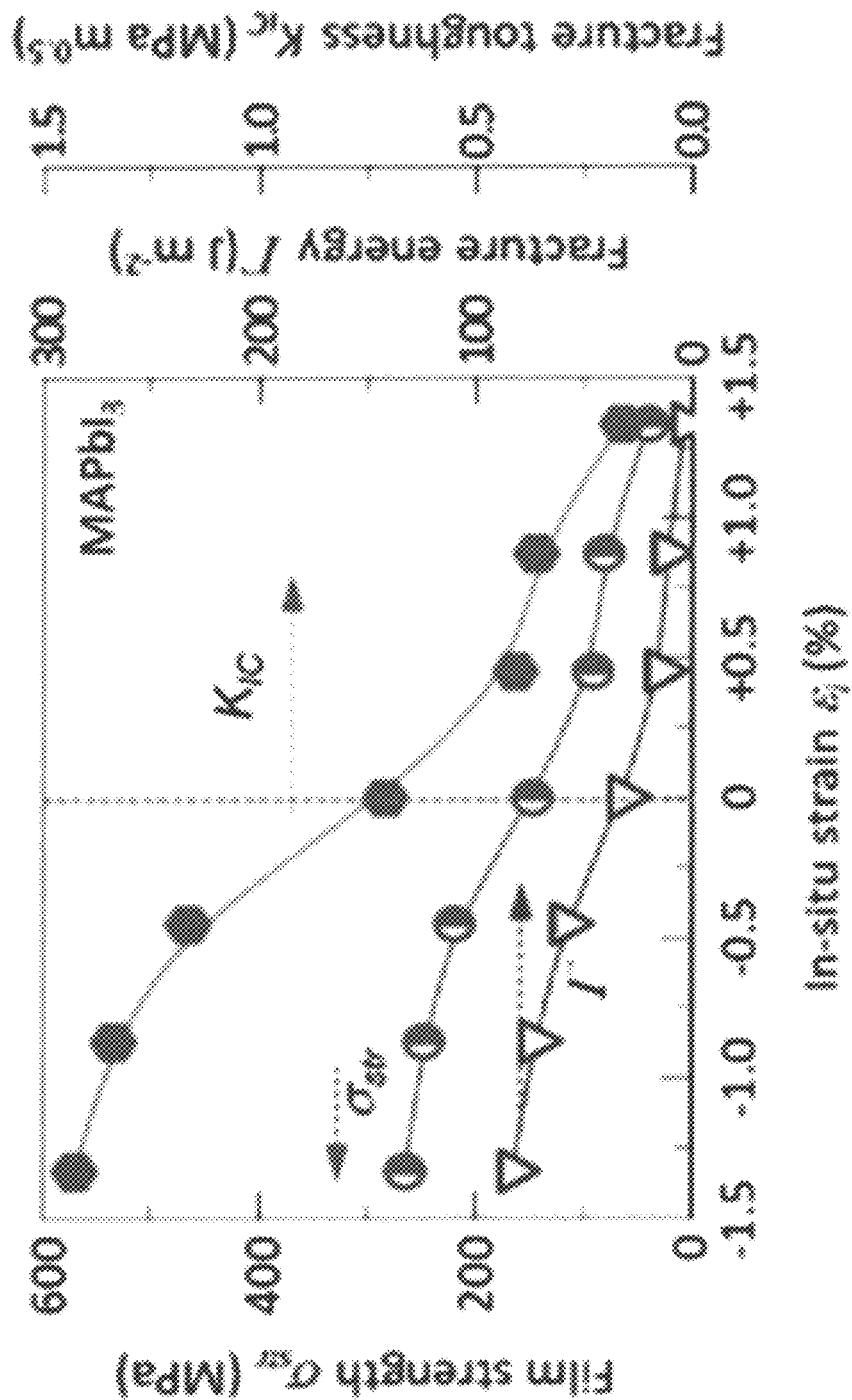
Figure 17G:
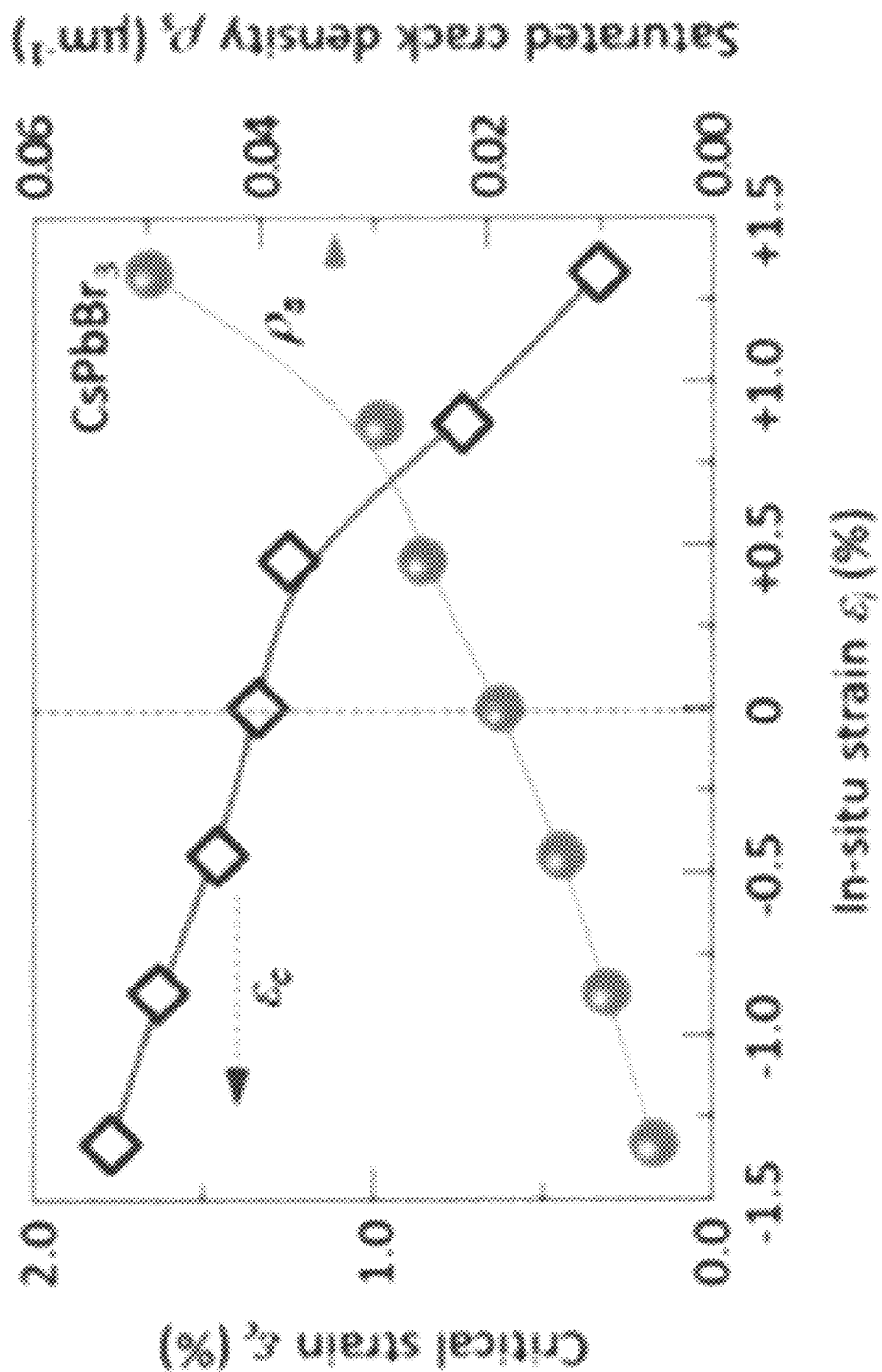

FIG. 17E shows that changes in the crack density ρ in the $MAPBI_3$ thin film show a similar parabola curve regardless of the levels of $\varepsilon_b$ and $\varepsilon_i$. FIG. 17F shows $\sigma_{str}$, $\Gamma$, and $K^{IC}$ in the $MAPBI_3$ thin film, and similarly to the $CsPbBr_3$ thin film, the compressive in situ strain showed a remarkably beneficial effect. In the case of the $MAPBI_3$ thin film, the calculated $K_{IC}$ values ranged from 1.43 to 0.16 MPa m$^{0.5}$.

It can be seen that the $MAPbI_3$ film had a lower crack density distribution than that of the $CsPbBr_3$ film at the same εb value (see the plots of FIGS. 17B to 17E).

When an in-situ strain was applied, for example, when the compressive stress $\varepsilon_i$ was −1.33%, the critical strain $\varepsilon_c$ value was highest. Specifically, the critical strain $\varepsilon_c$ values were about 1.77% and 1.85% for the $CsPbBr_3$ thin film and the $MAPbI_3$ thin film, respectively. This means that the critical strain $\varepsilon_c$ values were improved by about 32% and about 16%, respectively, compared to that of the unstrained sample. The value of the saturation crack density of the $MAPbI_3$ film was smaller than that of the $CsPbBr_3$ film over the entire range of the bending strain $\varepsilon_b$. The hybrid $MAPbI_3$ film was more resistant to bending fracture than the inorganic $CsPbBr_3$ film. This seems to be because the hybrid halide is more ductile, and this ductility contributes to absorbing external stress and exhibiting greater resistance to cracking.

In most studies, inorganic oxide thin films had critical strain $\varepsilon_c$ values of only about 1.0% to 1.2%. Since the fracture resistance increased, the $MAPbI_3$ film exhibited greater values in $\sigma_{str}$, $\Gamma$, and $K_{IC}$ than the $CsPbBr_3$ film in the tensile or compressive strain range (see FIGS. 17C to 17F). This means that the $CsPbBr_3$ film requires less energy to generate cracks than the $MAPbI_3$ film. As the magnitude of the compressive strain $\varepsilon_i$ increased, the critical strain $\varepsilon_c$ increased and the saturation crack density $\rho_s$ decreased. This clearly shows that it is more beneficial to have compressive stress in the halide thin film to improve the bending fracture resistance.

Figure 18A:
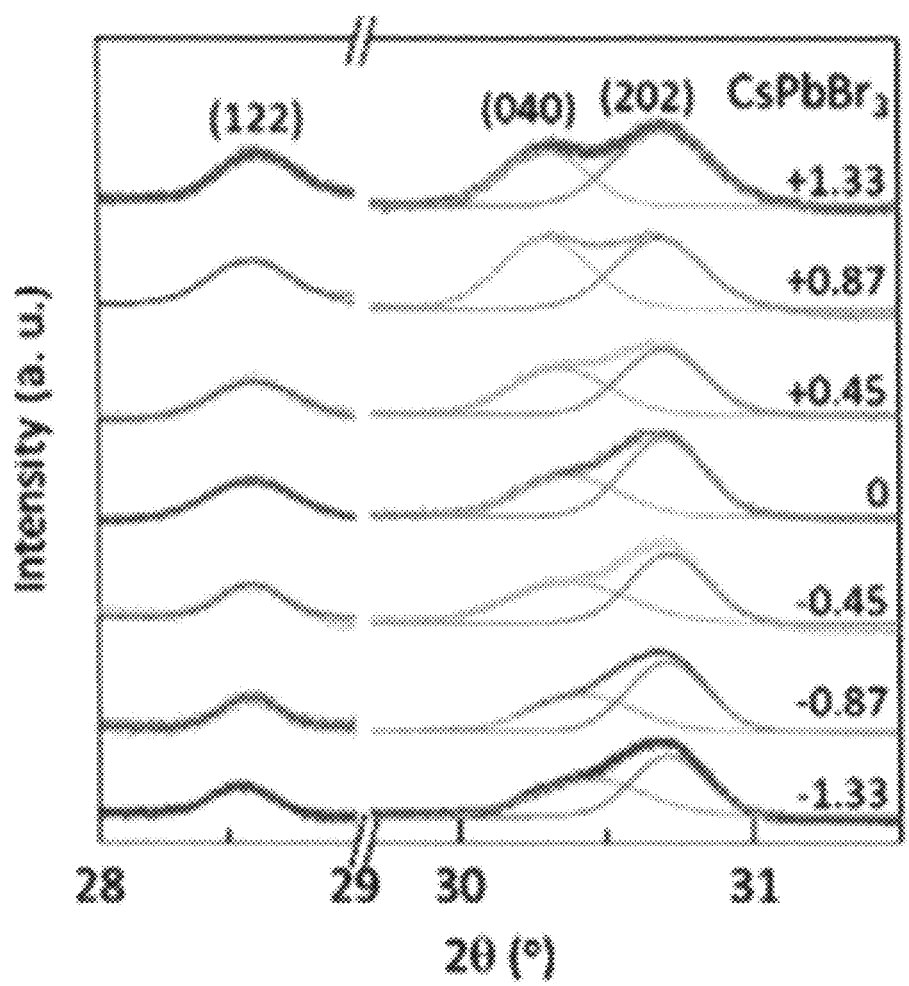
FIGS. 18A to 18F is a view showing the structural factors of fracture behavior according to an in-situ strain through high-resolution XRD (HR-XRD) analysis and structural simulation.
Figure 18B:
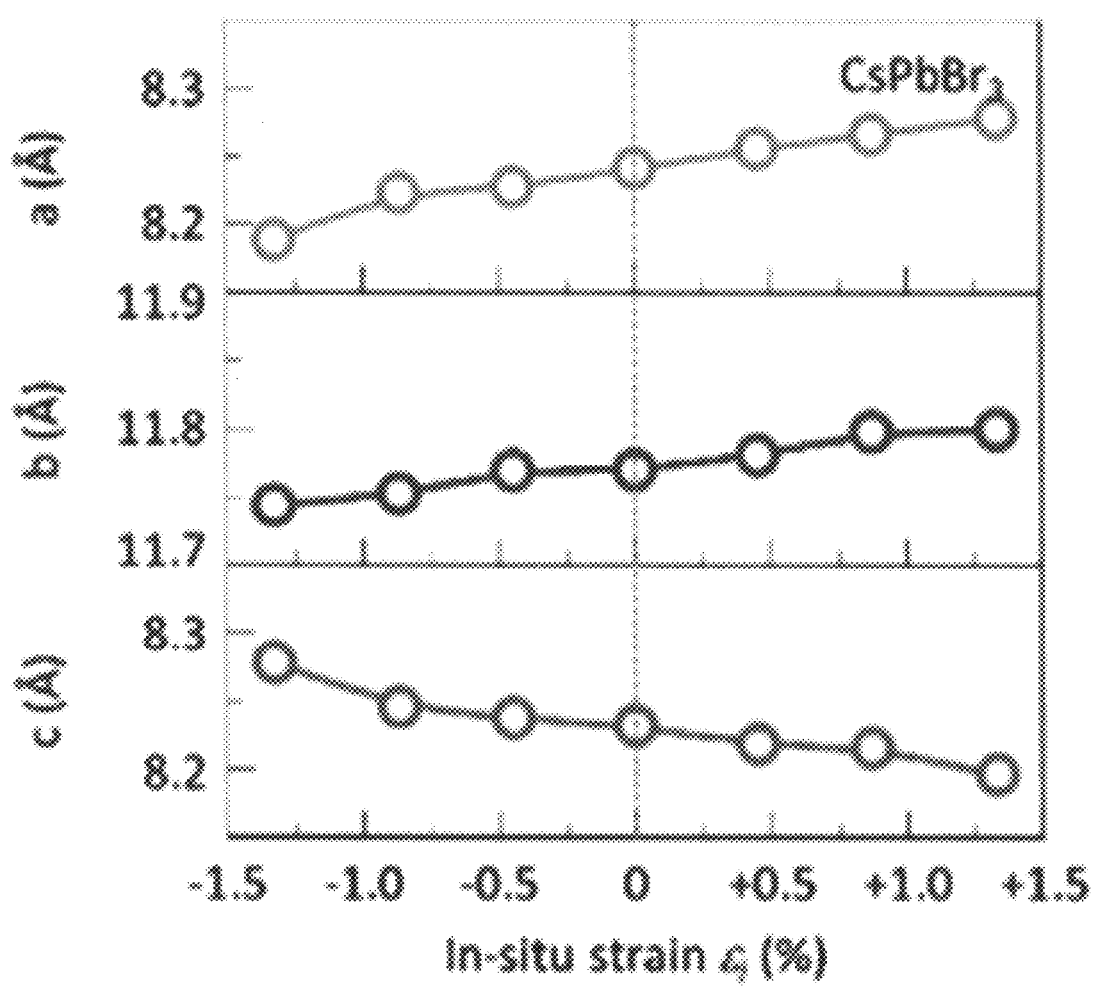
Figure 18C:
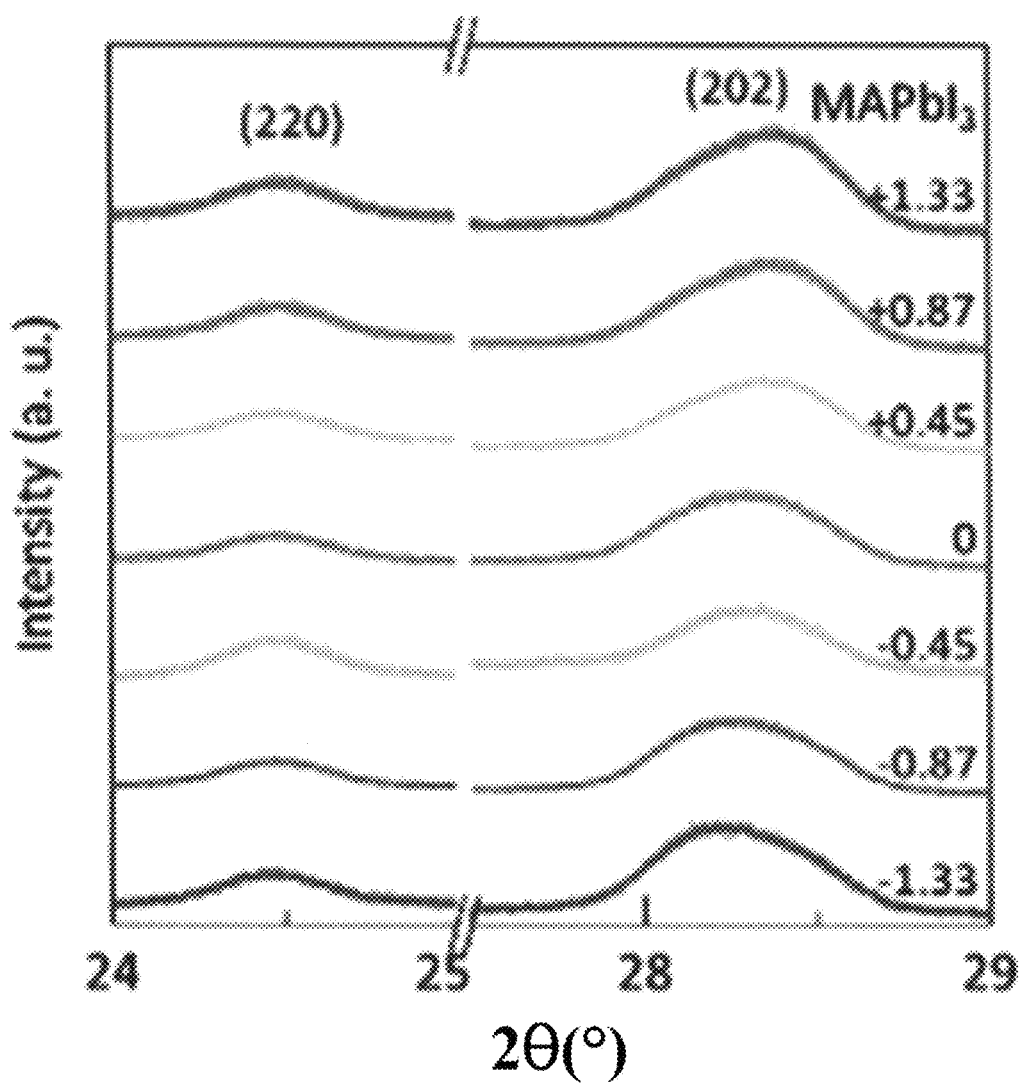
Figure 18D:
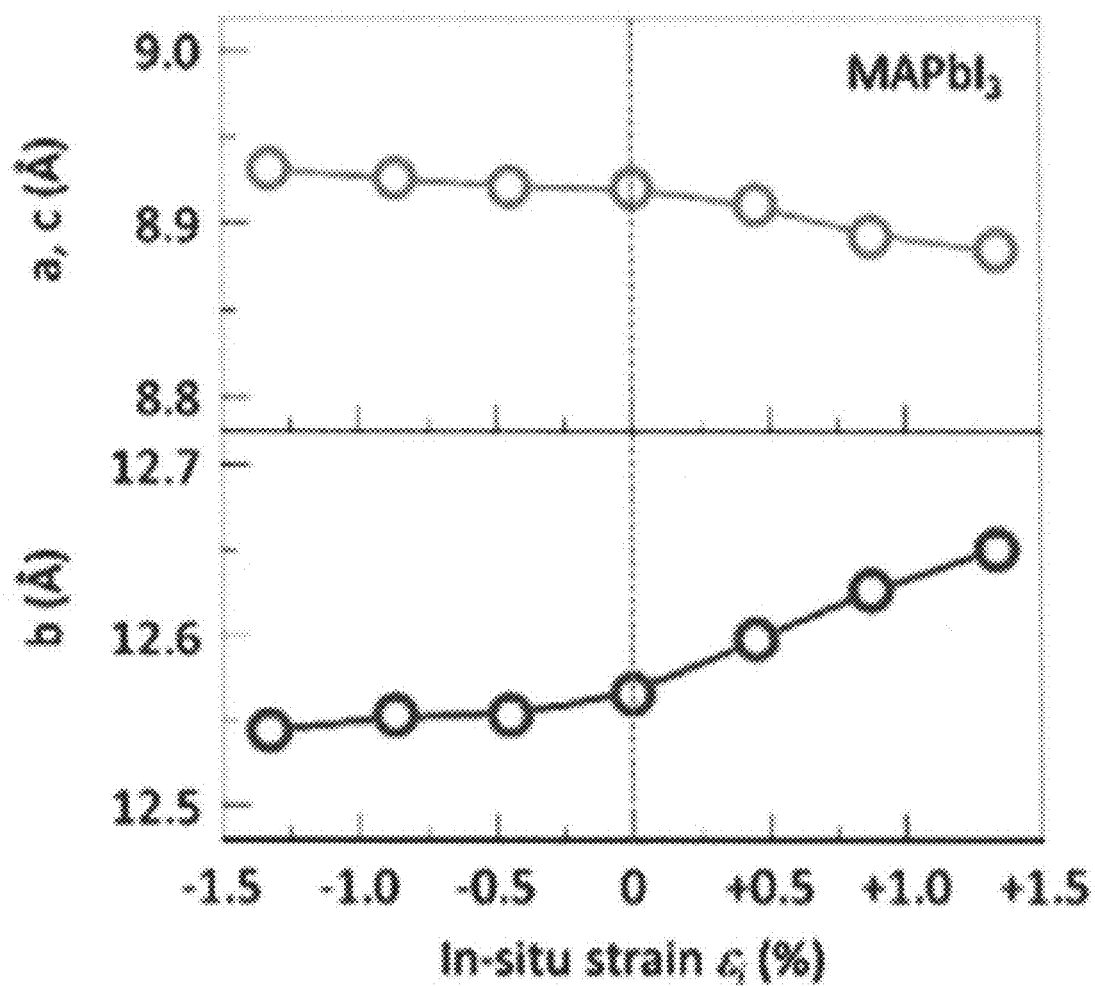

The structural factors of fracture behavior according to an in-situ strain were observed through high-resolution XRD (HR-XRD) analysis and structural simulation. All of the halide films exhibited perovskite structures regardless of whether tensile in-situ strain was applied or compressive in-situ strain was applied. FIG. 18A shows an XRD pattern of a $CsPbBr_3$ thin film subjected to compressive or tensile in situ strain. It can be seen that the (040) peak shifts toward a larger diffraction angle as the εi gradually changes from the tensile strain region to the compressive strain region. The lattice constants a, b, and c varied with the in-situ strain, as shown in FIG. 18B. A uniaxial strain was applied along the [010] direction. The lattice constant b gradually decreased with change in $\varepsilon_i$ from the maximum tensile strain (+1.33%) to the maximum compressive strain (−1.33%), confirming that the lattice shrinkage was caused by the in-situ strain. The lattice constant c is likely to increase with the compressive $\varepsilon_i$ due to the lattice stretching along the direction orthogonal to the lateral strain. Referring to the HR-XRD pattern of FIG. 18C, the $MAPbI_3$ thin film exhibits the tetragonal (I4/mcm) structure at the (220) and (202) peaks. As in the case of the $CsPbBr_3$ the $MAPbI_3$ film also exhibited changes in the lattice constant b due to the compressive or tensile stress along the in-situ strain direction (FIG. 18D).

Figure 18E:
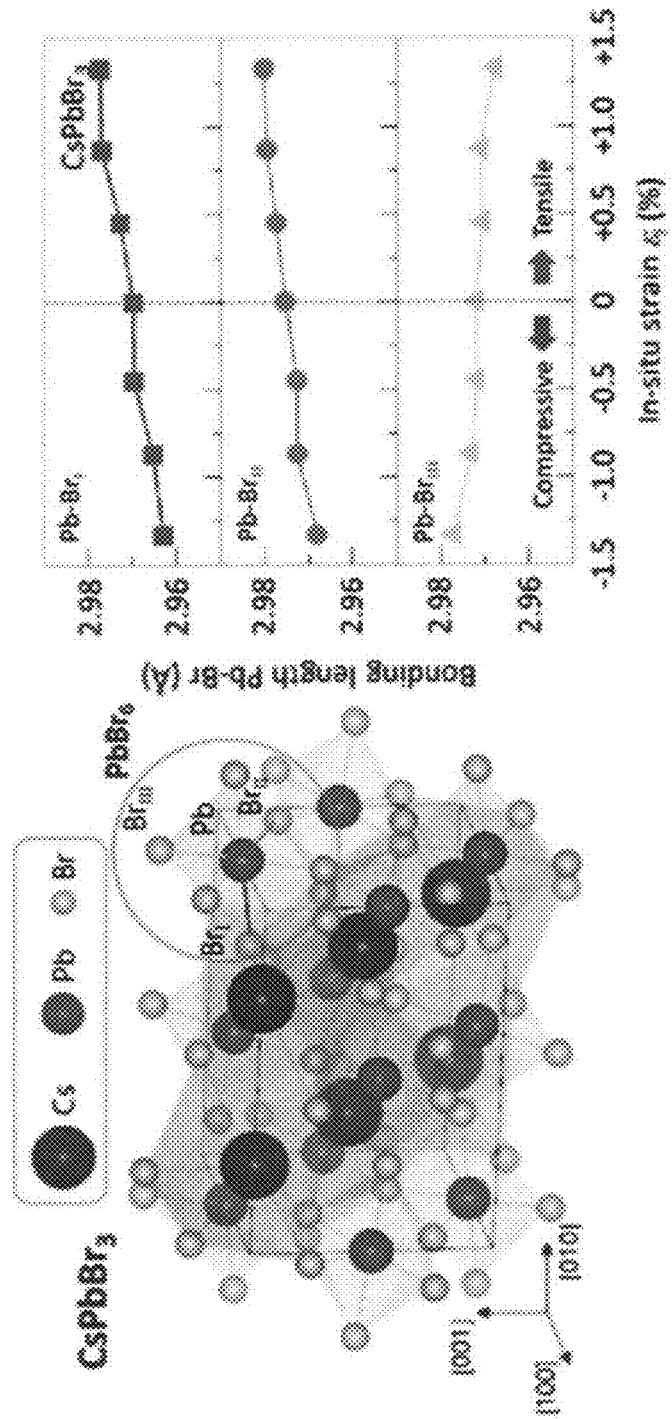

The appearance of the unit cell with compressive strain for each of the orthorhombic $CsPbBr_3$ film and the tetragonal $MAPbI_3$ film is shown, in which the three Pb—X bond lengths of each halide are indicated. In the case of the $CsPbBr_3$ thin film, as shown in FIG. 18E, the bond lengths of Pb—$Br_I$ and Pb—$Br_{II}$ in the ab plane (corresponding to the direction of the in-situ strain $\varepsilon_i$) became shorter but the bond length of Pb—$Br_{III}$ became longer as the compressive stress increased. The bond length of Pb—BrIII in the apical plane (extending along the film thickness direction) slightly increased due to the lateral shrinkage when compressive stress was applied. In the case of tensile strain, the opposite behavior was observed.

Figure 18F:
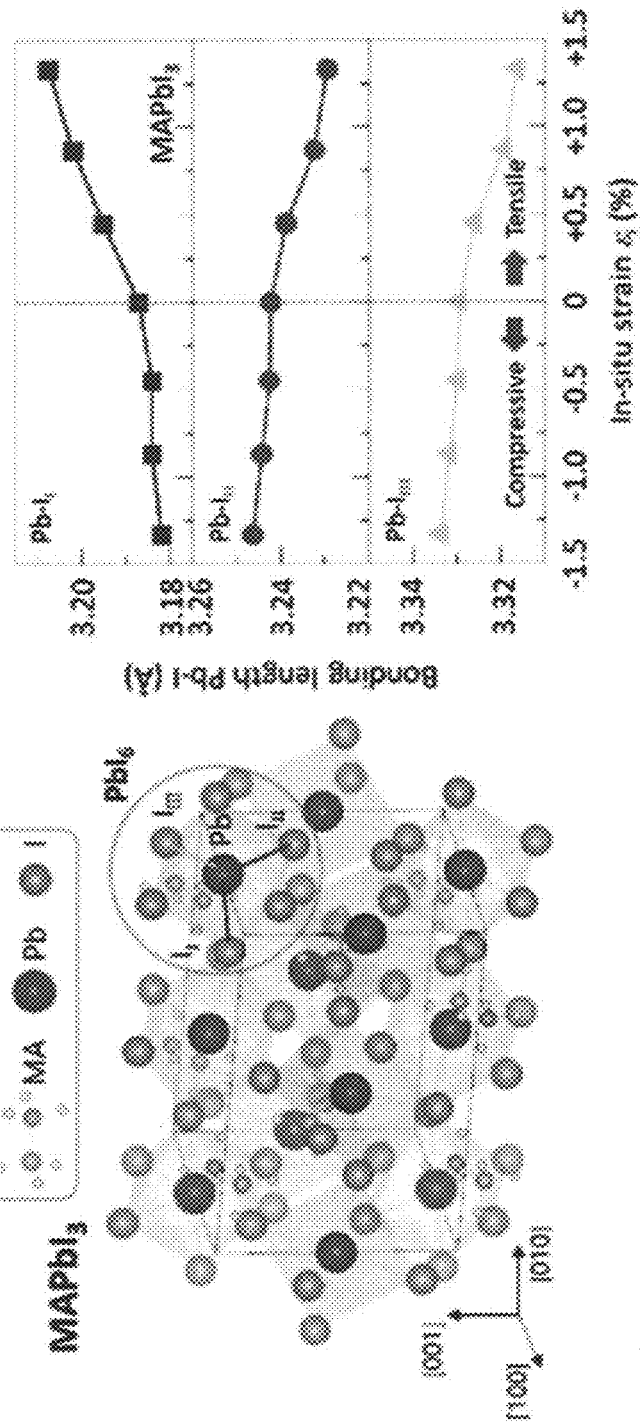

In the case of the $MAPbI_3$ thin film (FIG. 18F), similar behavior was observed in the bond lengths of Pb-II, Pb-III, and Pb-IIII according to the in-situ strain. For example, Pb-II binding along the direction of the in-situ strain was contracted. The decrease in bond length between atoms with octahedral shrinkage was inversely proportional to bond strength, which appears to contribute to the mechanical strength.

In addition, the structural change according to strain was confirmed by estimating the bond angle in the halide.

Figure 19A:
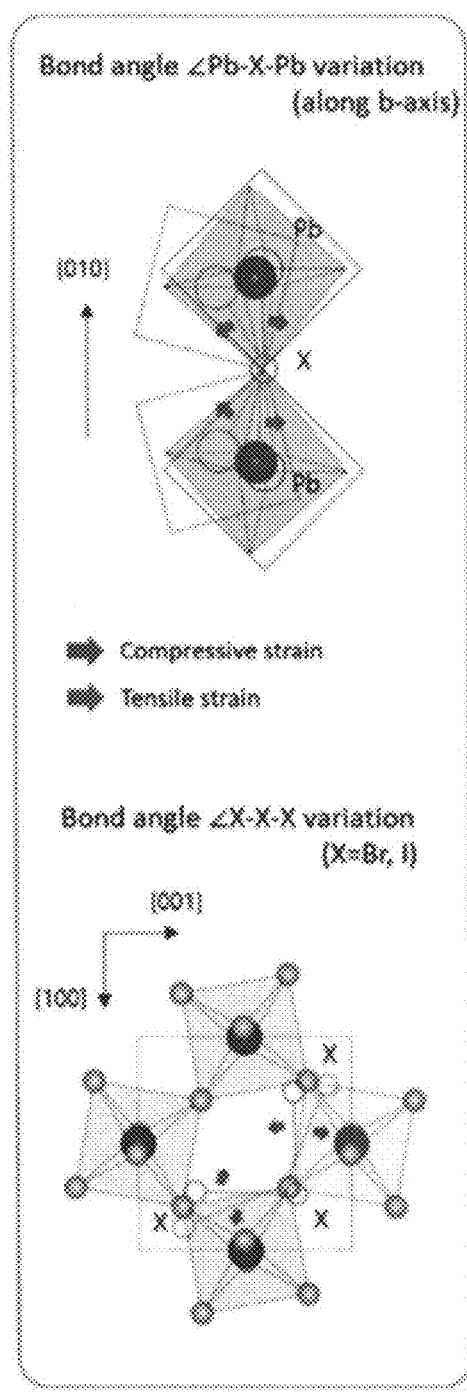
FIGS. 19A to 19C is a view to confirm structural change according to strain by estimating a bonding angle.
Figure 19B:
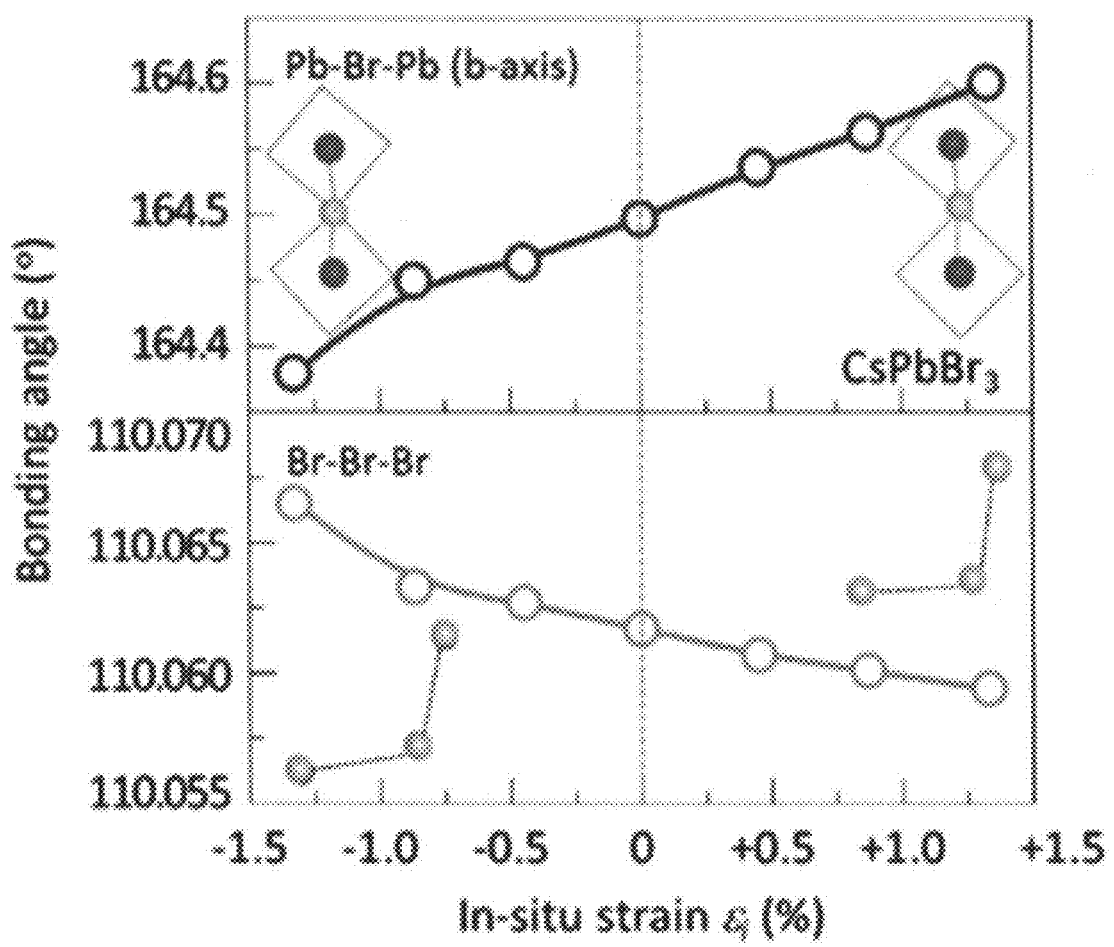
Figure 19C:
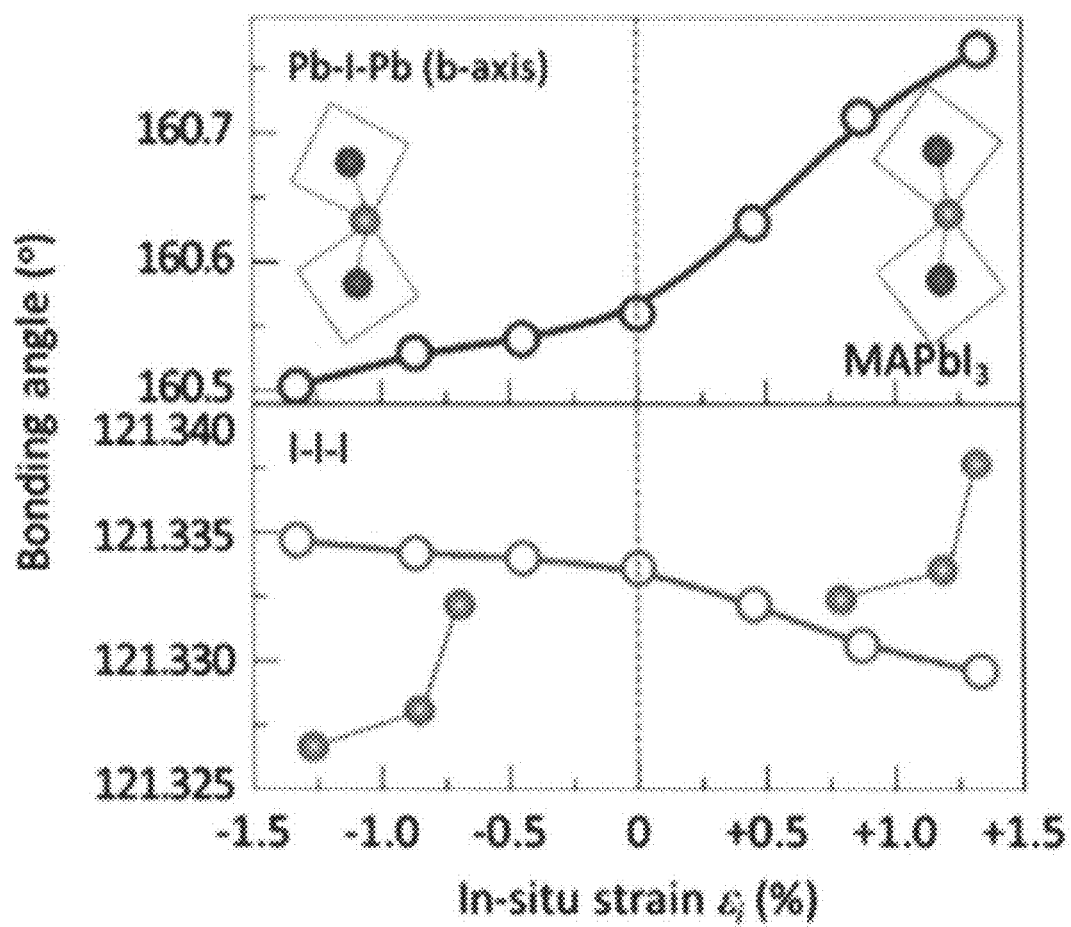

FIG. 19A schematically shows halide structures with bond angles represented by Pb—X—Pb and X—X—X bonds in an APbX3 unit. The changes in the bond angle when the strain εi was applied are shown in FIGS. 19B and 19C for the $CsPbBr_3$ and the $MAPbI_3$, respectively. The larger the compressive strain the smaller the Pb—X—Pb bond angle (angle along the b-axis) but the larger the X—X—X bond angle. The increase in the X—X—X bond angle means that the octahedron is distorted in the vertical direction due to the lateral compressive stress. Considering the changes in the associated bond length and the bond angle, it appears that a maximum compressive strain of −1.33% gives the highest energy bather to cracking and improves fracture resistance.

Although it is difficult to define the exact correlation between structural change and fracture resistance due to the polycrystalline nature of the film, it appears that the high compressive stress causes the octahedron to be largely warped, and the warped octahedron contributes to the better mechanical behavior.

Table 2 below summarizes the mechanical properties obtained through the evaluation of the bending fracture.

TABLE 2

| $\varepsilon_i$ (%) | E (GPa) | H (GPa) | $\varepsilon_c$ (%) | $\delta_{xtr}$ (MPa) | Γ (J/m²) | $K_{IC}$ (MPa m$^{0.5}$) |
|---|---|---|---|---|---|---|
| (a) $CsPbBr_3$ | | | | | | |
| −1.33 | 18.6 | 0.77 | 1.77 | 191 | 54.1 | 1.00 |
| −0.87 | 13.5 | 0.75 | 1.63 | 128 | 28.4 | 0.62 |
| −0.45 | 12.4 | 0.63 | 1.46 | 105 | 20.1 | 0.50 |
| 0 | 11.5 | 0.62 | 1.34 | 89 | 15.0 | 0.42 |
| +0.45 | 10.1 | 0.58 | 1.25 | 73 | 10.8 | 0.33 |
| +0.87 | 9.0 | 0.54 | 0.74 | 39 | 3.2 | 0.17 |
| +1.33 | 8.0 | 0.41 | 0.34 | 16 | 0.6 | 0.07 |
| (b) $MAPbI_3$ | | | | | | |
| −1.33 | 24.6 | 0.64 | 1.85 | 265 | 82.6 | 1.43 |
| −0.87 | 24.6 | 0.63 | 1.74 | 248 | 72.7 | 1.34 |
| −0.45 | 23.2 | 0.61 | 1.63 | 220 | 58.6 | 1.17 |
| 0 | 15.9 | 0.54 | 1.59 | 147 | 31.7 | 0.71 |
| +0.45 | 11.4 | 0.37 | 1.39 | 92 | 14.6 | 0.41 |
| +0.87 | 11.2 | 0.36 | 1.25 | 82 | 11.6 | 0.36 |
| +1.33 | 8.6 | 0.35 | 0.79 | 39 | 3.1 | 0.16 |

Although the present disclosure has been described above with reference to the exemplary embodiments, it will be appreciated that those skilled in the art variously modify and change the present disclosure without departing from the spirit and scope of the present disclosure as set forth in the appended

What is claimed is:
1. A power generation device comprising:
a flexible substrate; and
an active layer disposed on the flexible substrate,
wherein the active layer comprises halide perovskite and has a strain,
wherein the strain is a tensile strain and the active layer is a photoelectric active layer,
wherein the tensile strain is within a range of +0.6% to +1.35%,
wherein the strain is a compressive strain and the active layer is a piezoelectric layer, and
wherein the compressive strain is within a range of −0.6% to −1.35%.
2. The power generation device of claim 1, wherein the halide perovskite is represented by the following Formula 1:

$$ABX_3 \qquad \text{[Formula 1]}$$

in Formula 1,
A is Rb, Cs, Fr, $CH_3NH_3^+$, $NR_4^+$ (wherein R is hydrogen or alkyl having 1 to 10 carbon atoms and Rs are the same or different from each other), $[CH(NH_2)_2]^+$, or a combination thereof,
B is Pb, Sn, Bi, Ge, Ga, Ti, In, Sb, Mn, or a combination thereof, and
X is Cl, Br, I, or a combination thereof.
3. The power generation device of claim 2, wherein in Formula 1, A is Cs, and B is Pb.
4. The power generation device of claim 1, wherein the active layer comprises the halide perovskite that is in a film form.
5. A photodetector comprising:
a flexible substrate; and
a photoelectric active layer disposed on the flexible substrate,
wherein the active layer comprises halide perovskite and has a tensile strain, and wherein the photodetector has a responsivity (R) of 50 mA/W or more at a light intensity of 0.35 to 0.55 mW/cm$^2$.

6. A piezoelectric device comprising:

a flexible substrate; and a piezoelectric layer disposed on the flexible substrate, wherein the piezoelectric layer comprises halide perovskite and has a compressive strain, and wherein the compressive strain is in a range of −0.6% to −1.35%, and fracture energy $I^-$ determined through a bending fracture evaluation is increased by at least 25% compared to a case where the compressive strain is 0%.

* * * * *